(12) United States Patent
Nishi

(10) Patent No.: US 6,279,881 B1
(45) Date of Patent: Aug. 28, 2001

(54) METHOD AND APPARATUS WHICH EXPOSES A SECOND OBJECT WITH A PATTERN FORMED ON A FIRST OBJECT AND WHICH PERFORMS STATISTICAL CALCULATION BASED ON POSITION INFORMATION OF MARKS ON THE FIRST OBJECT

(75) Inventor: Kenji Nishi, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/512,103

(22) Filed: Feb. 24, 2000

Related U.S. Application Data

(62) Division of application No. 09/181,912, filed on Oct. 29, 1998, now Pat. No. 6,051,843, which is a division of application No. 08/831,770, filed on Apr. 2, 1997, now Pat. No. 5,844,247, which is a division of application No. 08/608,086, filed on Feb. 28, 1996, now Pat. No. 5,646,413, which is a continuation of application No. 08/476,912, filed on Jun. 7, 1995, now abandoned, which is a continuation of application No. 08/203,037, filed on Feb. 28, 1994, now abandoned.

(51) Int. Cl.$^7$ .................................................. G03F 9/00
(52) U.S. Cl. ........................... 258/548; 356/399; 355/53
(58) Field of Search ............................. 250/548; 355/43, 355/53, 55; 356/399–401

(56) References Cited

U.S. PATENT DOCUMENTS

| | | | |
|---|---|---|---|
| 4,710,029 | * 12/1987 | Katoh | 356/401 |
| 4,801,208 | 1/1989 | Katoh et al. | 356/401 |
| 4,943,733 | 7/1990 | Mori et al. | 250/548 |
| 4,958,160 | 9/1990 | Ito et al. | 355/53 |
| 5,138,176 | * 8/1992 | Nishi | 250/548 |
| 5,168,306 | 12/1992 | Morimoto et al. | 355/53 |
| 5,194,893 | * 3/1993 | Nishi | 355/53 |
| 5,243,195 | * 9/1993 | Nishi | 356/401 |
| 5,506,684 | 4/1996 | Ota et al. | 356/401 |
| 5,521,036 | * 5/1996 | Iwamoto et al. | 250/548 |
| 5,646,413 | * 7/1997 | Nishi | 250/548 |
| 5,656,402 | * 8/1997 | Kasuga | 356/399 |

FOREIGN PATENT DOCUMENTS

| | | |
|---|---|---|
| 4-324923 | 11/1992 | (JP) . |
| 5-217835 | 8/1993 | (JP) . |

* cited by examiner

*Primary Examiner*—Stephone B. Allen
(74) *Attorney, Agent, or Firm*—Miles & Stockbridge P.C.

(57) ABSTRACT

There is disclosed an exposure method for transferring, using an optical system for illuminating a mask having patterns to be transferred on a substrate and a projection optical system for projecting images of the patterns to the substrate, the patterns to the substrate through the projection optical system by means of scanning the mask and the substrate synchronously relative to the projection optical system. The method comprises the steps of providing a plurality of measuring marks on the mask formed along a relative scanning direction, and providing a plurality of reference marks formed on the stage corresponding to the measuring marks, respectively, moving the mask and the substrate synchronously in the relative scanning direction to measure successively a displacement amount between the measuring marks on the mask and the reference marks, and obtaining a correspondence relation between a coordinate system on the mask and a coordinate system on the stage according to the displacement amount.

23 Claims, 19 Drawing Sheets

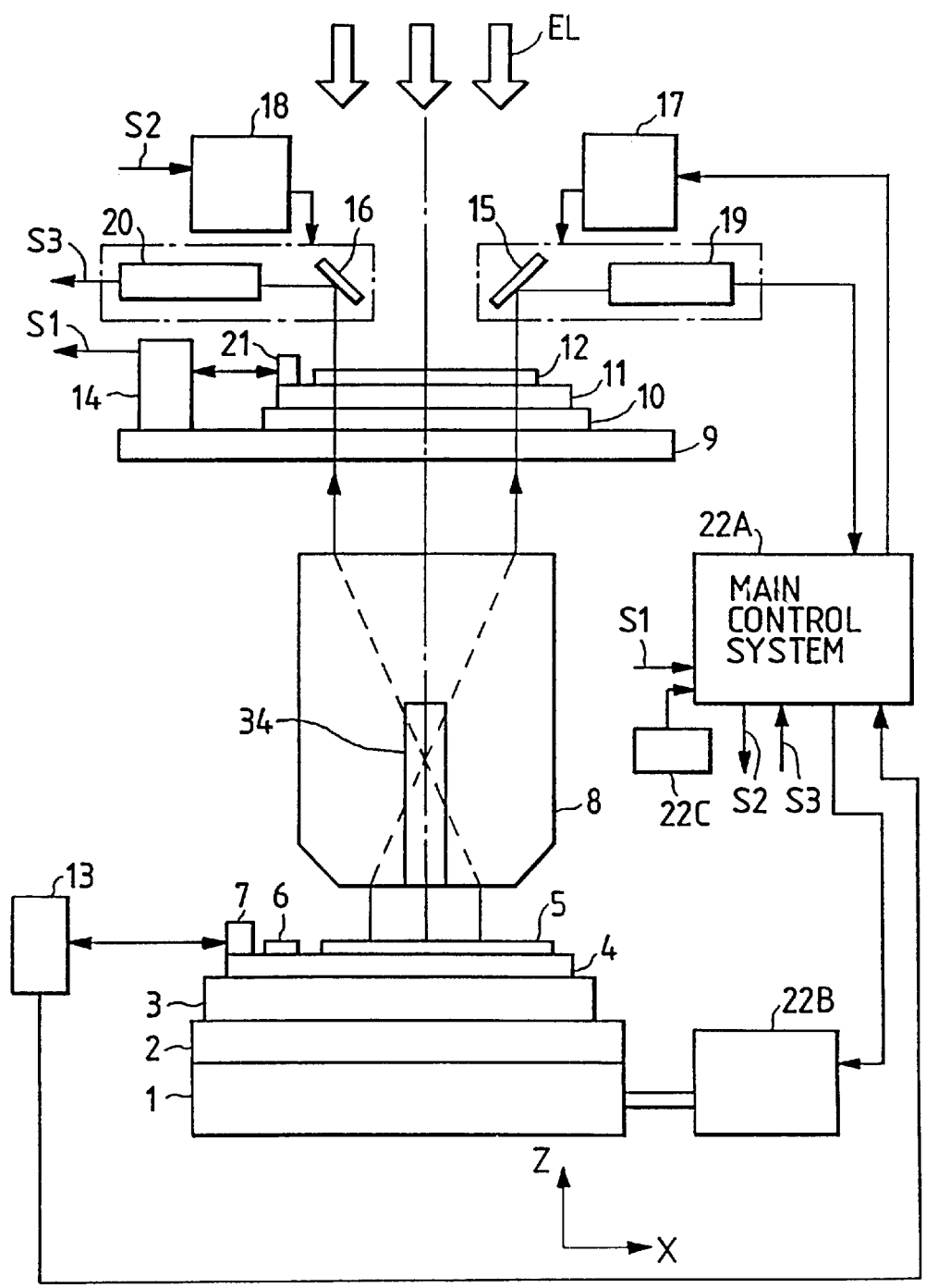

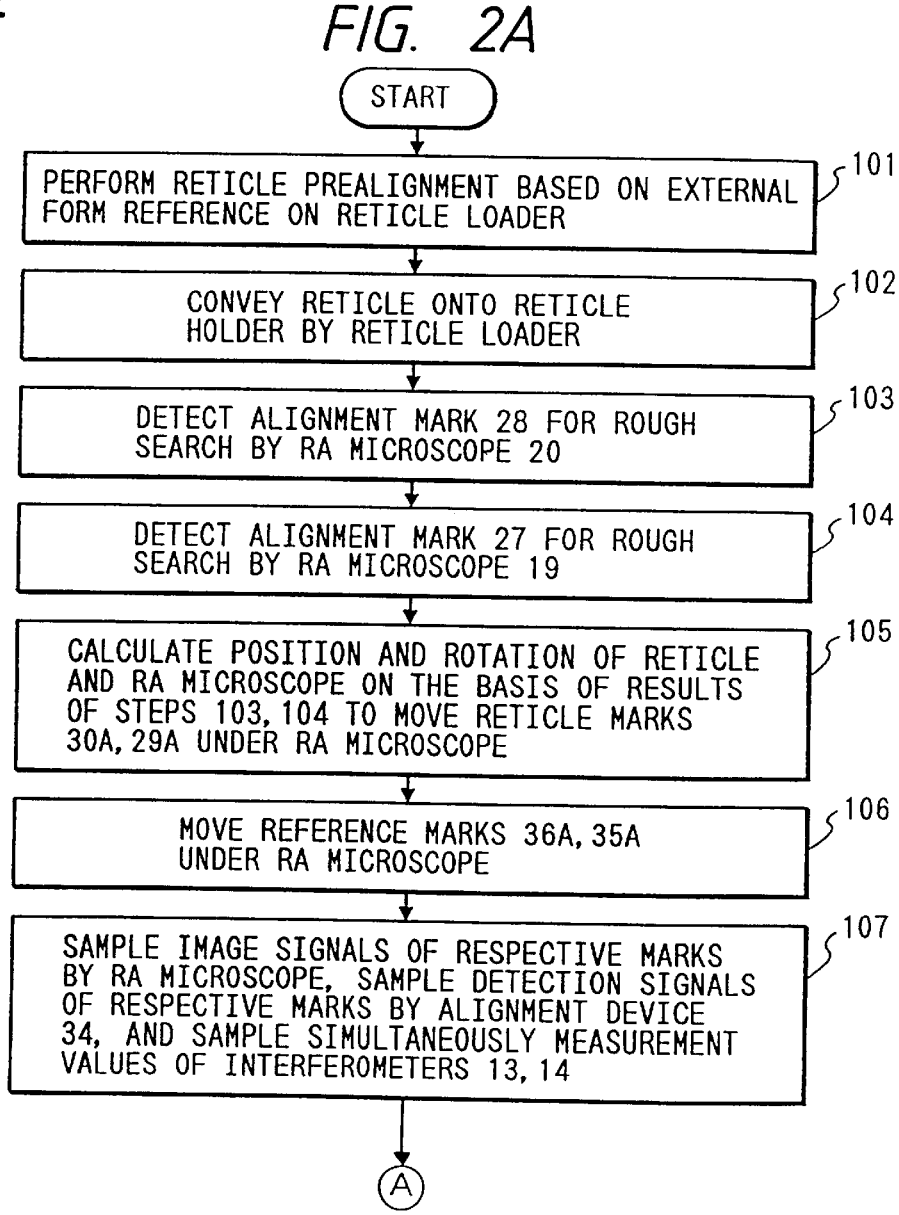

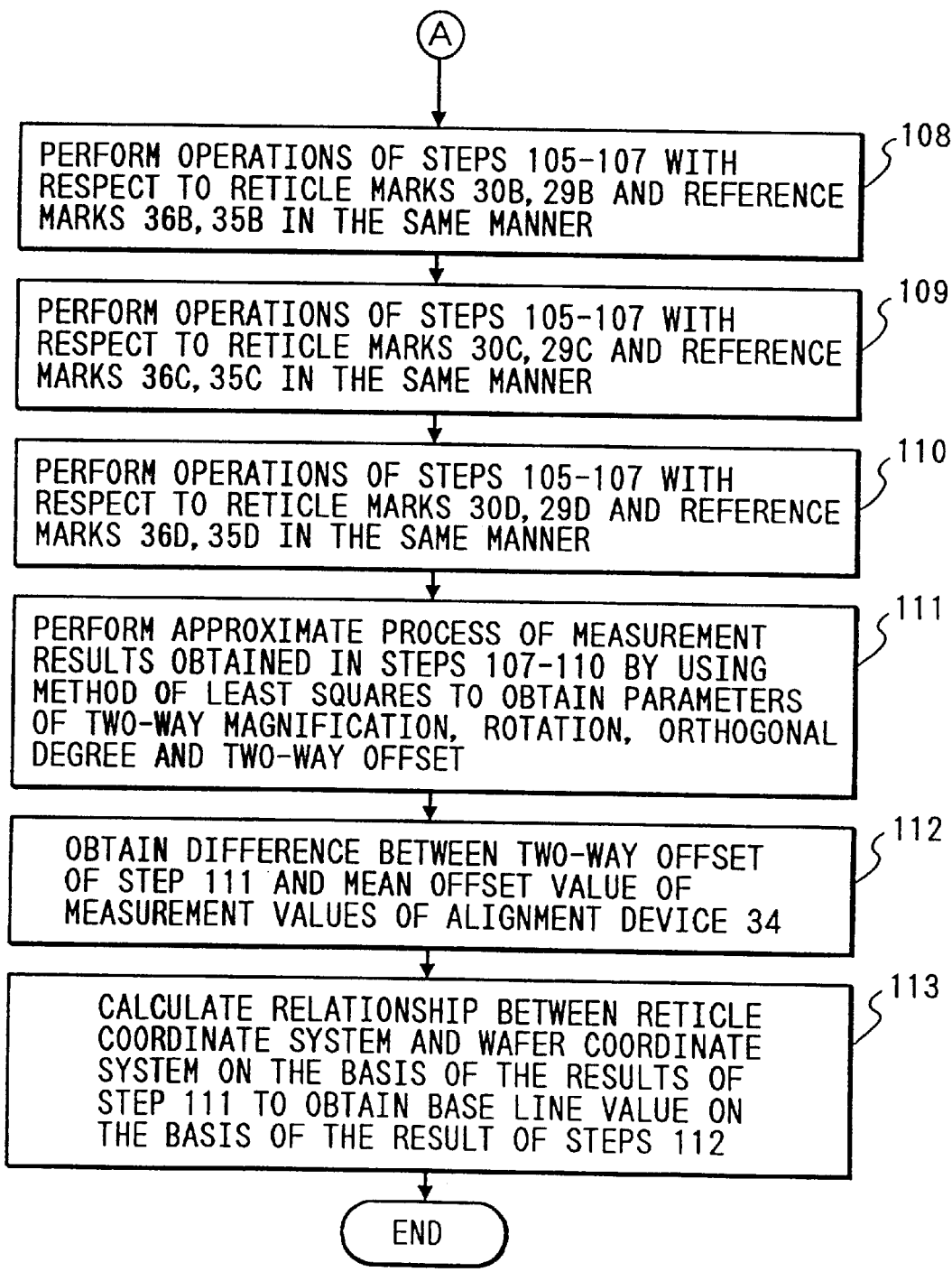

FIG. 6A
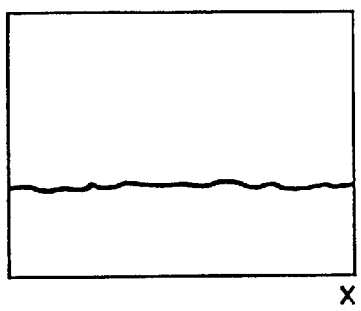
FIG. 6D
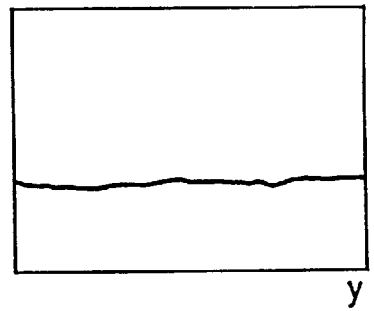
FIG. 6B
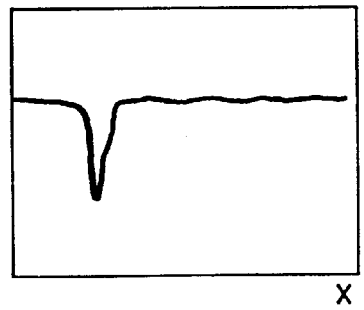
FIG. 6E
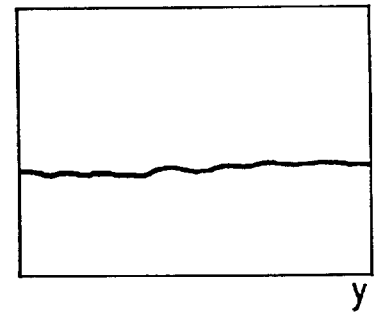
FIG. 6C
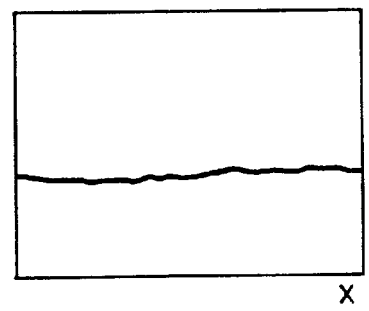
FIG. 6F
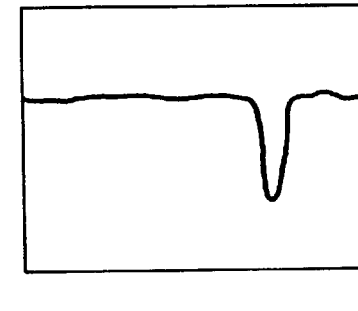
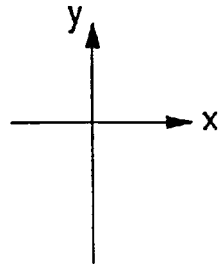
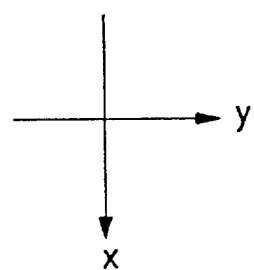

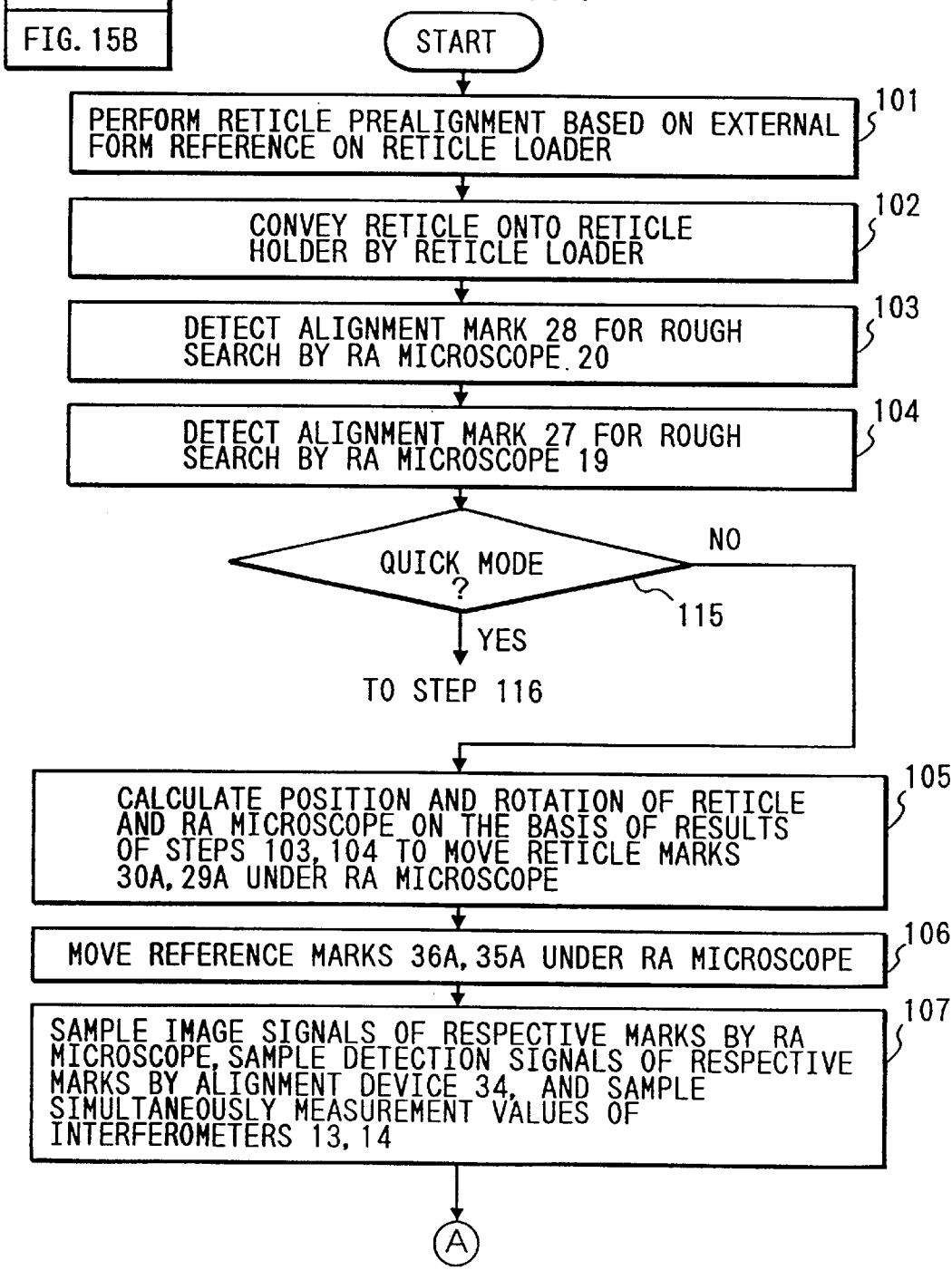

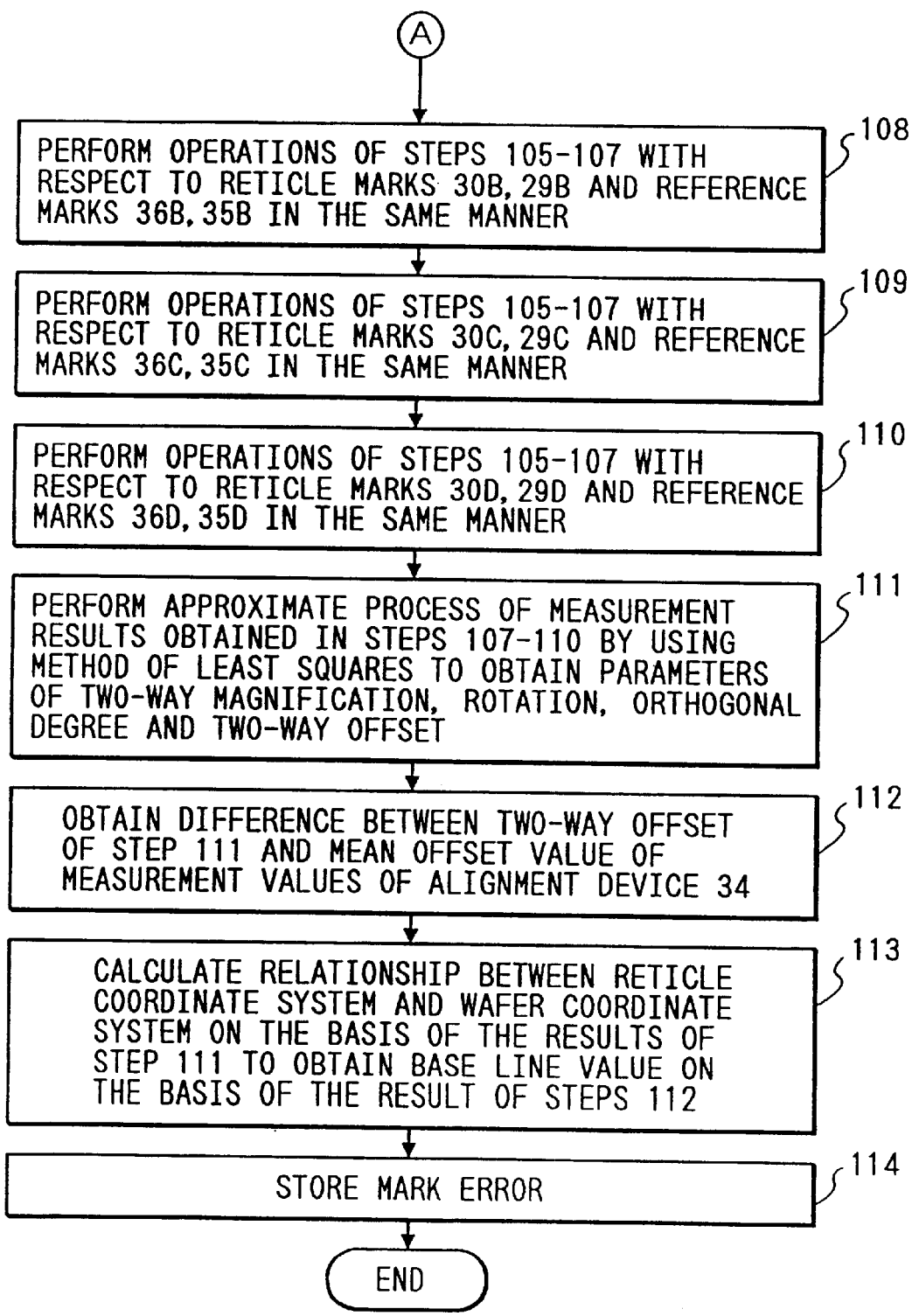

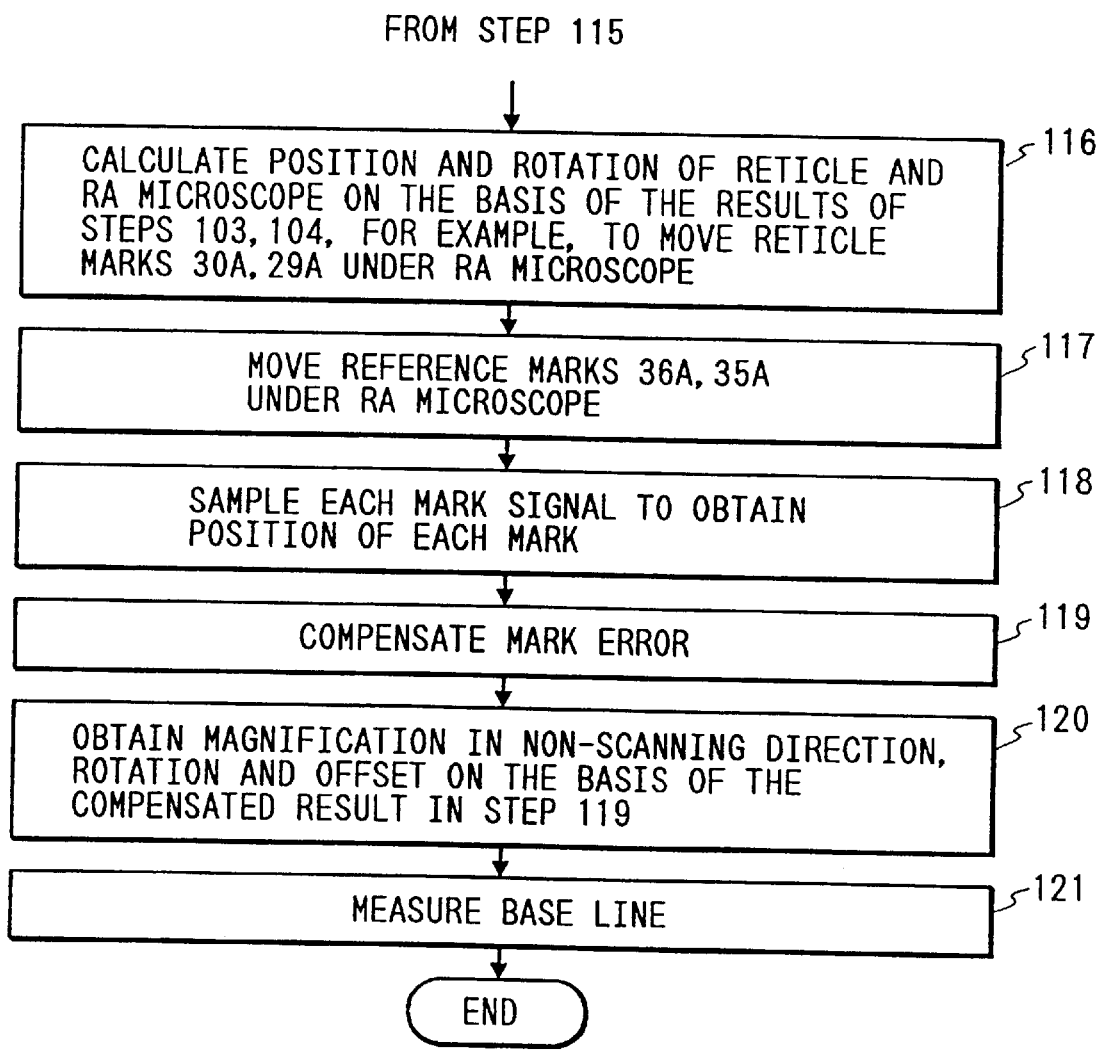

METHOD AND APPARATUS WHICH EXPOSES A SECOND OBJECT WITH A PATTERN FORMED ON A FIRST OBJECT AND WHICH PERFORMS STATISTICAL CALCULATION BASED ON POSITION INFORMATION OF MARKS ON THE FIRST OBJECT

CROSS-REFERENCE TO RELATED APPLICATIONS

This application is a division of application Ser. No. 09/181,912 filed Oct. 29, 1998 (now U.S. Pat. No. 6,051,843 issued Apr. 18, 2000), which is a division of application Ser. No. 08/831,770 filed Apr. 2, 1997 (now U.S. Pat. No. 5,844,247 issued Dec. 1, 1998), which is a division of application Ser. No. 08/608,086 filed Feb. 28, 1996 (now U.S. Pat. No. 5,646,413 issued Jul. 8, 1997), which is a continuation of application Ser. No. 08/476,912 filed Jun. 7, 1995 (abandoned), which is a continuation of application Ser. No. 08/203,037 filed Feb. 28, 1994 (abandoned).

BACKGROUND OF THE INVENTION

1. Field of the Invention

This invention relates to a method of exposing and an apparatus therefor. More particularly, the present invention relates to an exposure apparatus of, for example, a slit scanning exposure type and an exposure method advantageously applicable to such apparatus.

2. Related Background Art

Projection type exposure apparatus has been used in manufacturing semiconductor devices, liquid crystal displays and thin-film magnetic heads through a photolithography process, in which patterns of a photomask or a reticle (hereinafter, referred generally to as "reticle") are transferred to the surface of a substrate (wafer, glass plate, etc.) coated with a photosensitive coating.

The conventional projection type exposure apparatus commonly used is a reduction projection type exposure apparatus (stepper) that moves individual shots on the wafer successively to an exposing field of a projection optical system to reproduce pattern images of the reticle on the shots using a photographic step-and-repeat process.

In the typical steppers, a wafer coordinate system is corresponded to a reticle coordinate system (reticle alignment).

Some steppers comprise an alignment microscope of an off-axis type provided at one side surface of the projection optical system to detect a position of the alignment mark (wafer mark) formed as a correspondence to each shot on the wafer. In such a case, the shot on the wafer is determined within the exposing field of the projection optical system according to the position of the associated wafer mark detected on the alignment microscope. Accordingly, so-called base line amount should be obtained previously that represents a distance between a reference point (such as an exposure center) within the exposing field of the projection optical system and a reference point in an observing field of the alignment microscope of the off-axis type.

The reticle alignment and the base line measurement are disclosed in detail in, for example, Japanese Patent Application Laid-Open No. 4-324923 (corresponding to U.S. patent application Ser. No. 872,750 (filed on Apr. 21, 1992)).

In recent years, fine patterns for the semiconductor devices require resolution of the projection optical system to be improved. To improve the resolution, exposing light may be shifted to a shorter wavelength or alternatively, the number of openings of the projection optical system may be increased. In any event, it has been difficult to maintain an image quality (such as distortion and image plate deformation) on the entire exposing field with a predetermined accuracy when it is intended to ensure as same exposing field as conventional arts. With this respect, the projection type exposure apparatuses based on so-called slit scanning exposure type have taken a favorable turn.

In the projection type exposure apparatus of the slit scanning exposure type, the reticle and the wafer are scanned relative to and synchronous with a rectangular or arc-shaped illumination field (hereinafter, referred to as a "slit-shaped illumination field") to transfer the patterns of the reticle on the wafer. The slit scanning exposure type thus makes it possible to reduce the exposing field of the projection optical system as compared with the stepper type, provided that the reproduced patterns are equal in area to those reproduced using the stepper type. This may improve the accuracy of the image quality within the exposing field. A six-inch size is dominant for the conventional reticles while a one-fifth factor is dominant as the projection magnification of the projection optical system. At the magnification of one-fifth factor, the six-inch reticle may sometimes be insufficient for recent circuit patterns of the semiconductor device having the increased area. As a result, the projection optical systems should so designed that the projection magnification of the projection optical system is changed to, for example, quarter factors. To comply with requirements for such reproduced patterns having the increased area, the slit scanning exposure type can advantageously be applied.

In this event, the alignment method based on the reticle and wafer coordinate systems used in the conventional steppers may be unfavorable when being applied to the projection type exposure apparatus of the slit scanning type. The projection magnification of quarter factors adversely affects the accuracy of the alignment because the alignment becomes more sensitive to writing errors of the circuit patterns on the reticle.

A technique has been suggested in the above mentioned U.S. patent application Ser. No. 872,750 (filed on Apr. 21, 1992) to measure a rotation angle of the reticle by means of measuring simultaneously the amount of displacement of two or more measuring marks rather than moving the wafer stages in the wafer. However, the idea of measuring the rotation angle using the simultaneous measuring of the measuring marks cannot be applied to scanning directions of the projection type exposure apparatus of the slit scanning exposure type. Thus, there is a disadvantage that it is impossible to measure the rotation angle of the reticle and wafer coordinate systems and orthogonal amount of the coordinates of these coordinate systems.

As for the method of measuring the base line amount between the reference position within the exposing field of the projection optical system and the reference position of the alignment system of the off-axis type, the conventional measuring method using a pair or marks on the reticle in the stepper is disadvantageous, when it is applied to the projection type exposure apparatus of the slit scanning exposure type with no modification, in that the writing error of the reticle significantly affects the measurements.

SUMMARY OF THE INVENTION

With respect to these problems, the present invention is directed to provide an exposure method and an exposure apparatus capable of reducing affect of the writing error between the patterns on the reticle (mask), allowing positive alignment of the reticle coordinate system (mask coordinate system) and the wafer coordinate system (substrate coordinate system) in the exposure apparatus of the slit scanning exposure type.

In light of this, speed of operation may sometimes be considered to be more important than the accuracy of alignment depending on the process. With this respect, another object of the present invention is to provide an exposure method and an exposure apparatus capable of aligning the reticle coordinate system (mask coordinate system) with the wafer coordinate system (substrate coordinate system) at a higher throughput.

Yet another object of the present invention is to provide an exposure method and an exposure apparatus capable of reducing affect of the writing error between the patterns on the reticle (mask), allowing positive measurement of the base line amount between the reference point in the exposing field of the projection optical system and the reference point of the alignment system in the exposure apparatus of the slit scanning exposure type.

Still another object of the present invention is to provide an exposure method and an exposure apparatus in which the alignment between the reticle coordinate system (mask coordinate system) and the wafer coordinate system (substrate coordinate system) as well as the base line amount are obtained for exposure.

In a case where the base line measurement is performed for every predetermined number of wafer replacements, speed of operation may be considered to be more important than the accuracy of alignment. At the same time, the reticle coordinate system (mask coordinate system) is preferably aligned to the wafer coordinate system (substrate coordinate system). With this respect, another object of the present invention is to provide an exposure method and an exposure apparatus capable of aligning the reticle coordinate system (mask coordinate system) to the wafer coordinate system (substrate coordinate system) and of measuring the base line therefor at a higher throughput for every predetermined number of wafer replacements.

It is yet another object of the present invention to provide an exposure method and an exposure apparatus using a plurality of measuring reticle marks to reduce affect of, for example, the writing errors between patterns on the reticle (mask).

It is still another object of the present invention to provide an exposure method and an exposure apparatus capable of aligning the reticle coordinate system (mask coordinate system) to the wafer coordinate system (substrate coordinate system) and of measuring the base line therefor with a high accuracy in consideration of an error component to a relative scanning direction of the mask to the wafer.

In an exposure method according to a first aspect of the present invention, it is provided with an exposure method of transferring, using an optical system for illuminating a mask having patterns to be transferred to a substrate and a projection optical system for projecting images of the patterns to the substrate, the patterns on the mask to the substrate on a stage through the projection optical system by means of scanning the mask and the substrate synchronously relative to the projection optical system, wherein the method comprises the steps of: providing a plurality of measuring marks on the mask formed along a relative scanning direction, and providing a plurality of reference marks formed on the stage corresponding to the measuring marks, respectively; moving the mask and the substrate synchronously in the relative scanning direction to measure successively a displacement amount between the measuring marks on the mask and the reference marks; and obtaining a correspondence relation between a coordinate system on the mask and a coordinate system on the stage according to the displacement amount.

In an exposure method according to a second aspect of the present invention, it is provided with an exposure method of transferring, using an exposure apparatus having an optical system for illuminating a mask having patterns to be transferred to a substrate, a mask stage for holding the mask, a substrate stage for holding the substrate, a projection optical system for projecting images of the patterns to the substrate, and an alignment system having its detection center at a position away from the optical axis of the projection optical system at a predetermined distance, the patterns to the substrate through the projection optical system by means of scanning the mask and the substrate synchronously relative to the projection optical system, wherein the method comprises the steps of providing a plurality of measuring marks formed on the mask along a relative scanning direction; providing first reference marks corresponding to a part of the measuring marks and second reference marks corresponding to the first reference marks, respectively, the first and the second reference marks being formed on the stage, the second reference marks being away from the first reference marks at a given distance that is recognized previously; moving the mask to the. relative scanning direction with the second reference marks observed through the alignment system to measure successively a displacement amount between the measuring marks on the mask and the first reference marks; and obtaining a distance between a reference point within an exposing field of the projection optical system and the detection center according to the displacement amount between the measuring marks and the first reference marks, to a displacement amount of the second reference marks observed through the alignment system, and to the given distance previously recognized.

In an exposure method according to a third aspect of the present invention, it is provided with an exposure method of transferring, using an exposure apparatus having an optical system for illuminating a mask having patterns to be transferred to a substrate, a mask stage for holding the mask, a substrate stage for holding the substrate, a projection optical system for projecting images of the patterns to the substrate, and an alignment system having its detection center at a position away from the optical axis of the projection optical system at a predetermined distance, the patterns to the substrate through the projection optical system by means of scanning the mask and the substrate synchronously relative to the projection optical system, wherein the method comprises the steps of providing a plurality of measuring marks formed on the mask along a relative scanning direction; providing first reference marks corresponding to each of the measuring marks and second reference marks corresponding to the first reference marks, respectively, the first and the second reference marks being formed on the stage, the second reference marks being away from the first reference marks at a given distance that is recognized previously; moving the mask and the substrate to a scanning direction to measure successively a displacement amount between the measuring marks on the mask and the first reference marks; moving the mask and the substrate relatively to the scanning direction to measure successively a displacement amount of the second reference marks; and obtaining a distance between a reference point within an exposing field of the projection optical system and the detection center according to the displacement amount between the measuring marks and the first reference marks, to a displacement amount of the second reference marks observed through the alignment system, and to the given distance previously recognized.

In an exposure method according to a fourth aspect of the present invention, it is provided with an exposure method of transferring, by means of illuminating an illumination area of a predetermined shape using an illumination light to scan a mask and a substrate synchronously relative to the illumination area of a predetermined shape, patterns on the mask within the illumination area of the predetermined shape through a projection optical system to the substrate on a stage, wherein the method comprises, with a plurality of measuring marks formed on the mask along a relative scanning direction and reference marks formed on the stage corresponding to the measuring marks, a first step for measuring a displacement amount between a part of the measuring marks and the reference marks corresponding to the part of the measuring marks, respectively; a second step for moving the mask and the substrate synchronously to the relative scanning direction to measure successively a displacement amount between the measuring marks on the mask and the reference marks corresponding to the measuring marks; and a third step for selecting one of the first and the second steps to obtain a corresponding relation between a coordinate system on the mask and a coordinate system on the stage according to the displacement amount between the measuring marks and the reference marks, respectively, obtained at the selected step.

In an exposure method according to a fifth aspect of the present invention, it is provided with an exposure method of transferring, using an exposure apparatus having an optical system for illuminating an illumination area of a predetermined shape using an illumination light, a mask stage for holding a mask provided with patterns to be exposed, a substrate stage for holding a substrate, a projection optical system for projecting the patterns on the mask to the substrate, an alignment system having its detection center at a position away from the optical axis of the projection optical system at a predetermined position, the patterns on the mask in the illumination area of the predetermined shape through the projection optical system to the substrate by means of scanning the mask and the substrate synchronously relative to the illumination area of the predetermined shape, wherein the method comprises, with a plurality of measuring marks formed on the mask along a relative scanning direction and a plurality of first reference marks corresponding to the measuring marks and second reference marks corresponding to the first reference marks, the first and the second reference marks being formed on the stage, the second reference marks being away from the first reference mark at a given distance that is recognized previously, a first step for measuring a displacement amount between a part of the measuring marks on the mask and the first reference marks corresponding to the part of the measuring marks, respectively, and measuring a displacement amount between the second reference marks corresponding to the part of the first reference mark; a second step for moving the mask and the substrate in synchronism with the scanning direction to measure successively a displacement amount between the measuring marks and the first reference marks corresponding to the measuring marks, respectively, and a displacement amount of the second reference marks; a third step for selecting one of the first and the second step; and a fourth step for obtaining a corresponding relation between a coordinate system on the mask stage and a coordinate system on the substrate stage and a distance between a reference point within an exposing field of the projection optical system and the detection center according to information obtained during the step selected at the third step and a given distance previously recognized.

In an exposure method according to a sixth aspect of the present invention, it is provided with an exposure method of transferring, using an exposure apparatus having an optical system for illuminating an illumination area of a predetermined shape using an illumination light, a mask stage for holding a mask provided with patterns to be exposed, a substrate stage for holding a substrate, a projection optical system for projecting the patterns on the mask to the substrate, an alignment system having its detection center at a position away from the optical axis of the projection optical system at a predetermined position, the patterns on the mask in the illumination area of the predetermined shape through the projection optical system to the substrate by means of scanning the mask and the substrate synchronously relative to the illumination area of the predetermined shape, wherein the method comprises, with a plurality of measuring marks formed on the mask along a relative scanning direction and a plurality of first reference marks corresponding to the measuring marks and second reference marks corresponding to the first reference marks, the first and the second reference marks being formed on the stage, the second reference marks being away from the first reference mark at a given distance that is recognized previously, for every replacement of predetermined number of substrates, a step for measuring a displacement amount between a part of the measuring marks on the mask and the first reference marks corresponding to the part of the measuring marks, respectively, and measuring a displacement amount between the second reference marks corresponding to the part of the first reference mark; and a step for obtaining a corresponding relation between a coordinate system on the mask and a coordinate system on the stage and a distance between a reference point within an exposing field of the projection optical system and the detection center according to a displacement amount between one measuring mark and one first reference mark, to a displacement amount of the second reference marks, and to the given distance recognized previously.

According to the first exposure method of this invention, it is possible to reduce affect of the writing error of the measuring marks on the mask by means of obtaining a parameter (such as the magnification, a scaling in the scanning direction, rotation, degree of parallelism in the scanning direction, and offsets in an X direction and a Y direction) for use in aligning the mask coordinate system with the substrate coordinate system by using the least square approximation by means of, finally, matching the displacement obtained, for example, at each position of the measuring mark on the mask.

According to the second exposure method, it is possible to measure positively the base line amount or the distance between the reference point of the projection optical system and the reference point of the alignment system by means of reducing the writing error of the measuring marks on the mask through measurement regarding to the measuring marks on the mask side.

According to the third exposure method, plurality of first reference marks are formed on a reference mark member with being correspondent with the measuring marks, respectively, on the mask. In addition, a plurality of second reference marks are formed at such a distance that corresponds to the distance between the reference point within the exposing field of the projection optical system and the reference point of the alignment system from the first reference marks. Accordingly, the base line amount can be measured more positively because the balancing is made across the reference marks.

According to the fourth exposure method, simple measuring steps based on a quick mode are selected, which allows calculation of the corresponding relation between the coordinate system on the mask and the coordinate system on the stage at a higher throughput depending on the necessities.

According to the fifth exposure method, simple measuring steps based on a quick mode are selected, which allows calculation of the corresponding relation between the coordinate system on the mask and the coordinate system on the stage as well as the base line amount at a higher throughput depending on the necessities.

According to the sixth exposure method, simple measuring steps based on a quick mode are performed for every exposure of a predetermined number of substrates, which allows calculation of the corresponding relation between the coordinate system on the mask and the coordinate system on the stage as well as the base line amount at a higher throughput when many substrates are subjected to exposure continuously through the scanning method.

In an exposure method according to a seventh aspect of the present invention, it is provided with an exposure method for transferring, by means of illuminating an illumination area of a predetermined shape using an illumination light and scanning a mask and a substrate synchronously relative to the illumination area of the predetermined shape, patterns on the mask in the illumination area of the predetermined shape to the substrate on a stage through a projection optical system, wherein the method comprises, with a plurality of measuring marks formed on the mask along a relative scanning direction and a plurality of reference marks formed on the stage corresponding to a part of the measuring marks, the steps of moving the mask to the relative scanning direction to measure successively a displacement amount between the measuring marks on the mask and the reference marks; and obtaining a corresponding relation between a coordinate system on the mask and a coordinate system on the stage.

In an exposure method according to an eighth aspect of the present invention, it is provided with an exposure method for transferring, using an exposure apparatus having an optical system for illuminating an illumination area of a predetermined shape using an illumination light, a mask stage for holding a mask provided with patterns to be exposed, a substrate stage for holding a substrate, a projection optical system for projecting the patterns on the mask to the substrate, an alignment system having its detection center at a position away from the optical axis of the projection optical system at a predetermined position, the patterns on the mask in the illumination area of the predetermined shape through the projection optical system to the substrate by means of scanning the mask and the substrate synchronously relative to the illumination area of the predetermined shape, wherein the method comprises the steps of forming on the substrate stage a reference mark detectable by the alignment system to measure a displacement amount of the reference marks by the alignment system; entering a mark error of the mask; and obtaining a corresponding relation between a coordinate system on the mask stage and a coordinate system on the substrate stage, and a distance between a reference pint within an exposing field of the projection optical system and the detection center.

In an exposure apparatus according to a first aspect of the present invention, it is provided with an exposure apparatus comprising a mask stage for holding a mask provided with patterns to be transferred; a substrate stage for holding a substrate; an optical system for illuminating the mask using an illumination light; a projection optical system for projecting images of the patterns on the mask to the substrate; and a first mark detecting system for detecting a mask mark formed at a predetermined position on the mask within an exposing field of the projection optical system, the exposure apparatus being for use in scanning the mask and the substrate synchronously relative to the projection optical system to transfer the patterns on the mask to the substrate through the projection optical system, wherein the apparatus further comprises a reference plate provided on the substrate stage, the reference plate comprising a plurality of first reference marks detectable by the first mark detecting system through the projection optical system; a plurality of measuring marks provided on the mask, each of the measuring marks being provided along a relative scanning direction with being correspondent with the reference mark; a driving control system for use in observing a part of the first reference marks and a part of the measuring marks through the first mark detecting system to move the mask stage and the substrate stage to the relative scanning direction such that a displacement amount between the measuring marks on the mask and the reference marks is measured successively; and calculating means for calculating a corresponding relation between a coordinate system on the mask stage and a coordinate system on the substrate stage.

In an exposure apparatus according to a second aspect of the present invention, it is provided with an exposure apparatus comprising a mask stage for holding a mask provided with patterns to be transferred; a substrate stage for holding a substrate; an optical system for illuminating the mask using an illumination light; a projection optical system for projecting images of the patterns on the mask to the substrate; and a first mark detecting system for detecting a mask mark formed at a predetermined position on the mask within an exposing field of the projection optical system, the apparatus being for use in scanning the mask and the substrate synchronously relative to the projection optical system to transfer the patterns on the mask to the substrate through the projection optical system, wherein the apparatus further comprises a reference plate provided on the substrate stage, the reference plate comprising a plurality of first reference marks detectable by the first mark detecting system through the projection system and second reference marks provided with being away from the first reference marks at a given distance that is recognized previously; a plurality of measuring marks provided on the mask, each of the measuring mask being provided along the relative scanning direction with being correspondent with the first reference mark; a driving control system for use in moving the mask stage and the substrate stage to the relative scanning direction such that the part of the measuring marks and the part of the reference marks are observed through the first mark detecting system and a displace amounts are measured successively between the measuring marks on the mask and the reference marks as well as between the second reference marks with one of a plurality of second reference marks being observed through a second mark detecting system; and calculating means for calculating a corresponding relation between a coordinate system on the mask stage and a coordinate system on the substrate stage and a distance between a reference point within an exposing field of the projection optical system and the detection center according to the displacement amounts measured.

BRIEF DESCRIPTION OF THE DRAWINGS

FIG. 1 is a structural diagram showing a projection type exposure apparatus to which an embodiment of a projection exposure method according to the present invention is applicable;

FIG. 2 is comprised of FIGS. 2A and 2B showing flow charts illustrating an exposure method and a baseline amount check method according to a first embodiment of the present invention;

FIGS. 6A, 6B, 6C, 6D, 6E and 6F Are views showing waveforms of image pick-up signals supplied from an image pick-up device during a rough alignment of the reticle;

FIG. 8D is an enlarged view showing an example of a reference mark 35A or the like;

FIG. 8E is a plan view showing an example of a reference mark 37A or like;

FIG. 15 is comprised of FIGS. 15A and 15B showing flow charts illustrating a part of operation of an exposure method and a base line amount check method according to a second embodiment;

FIG. 16 is a flow chart illustrating a remaining part of the operation of the alignment method and the base line amount check method according to the second embodiment.

DESCRIPTION OF THE PREFERRED EMBODIMENTS

Figure 3:
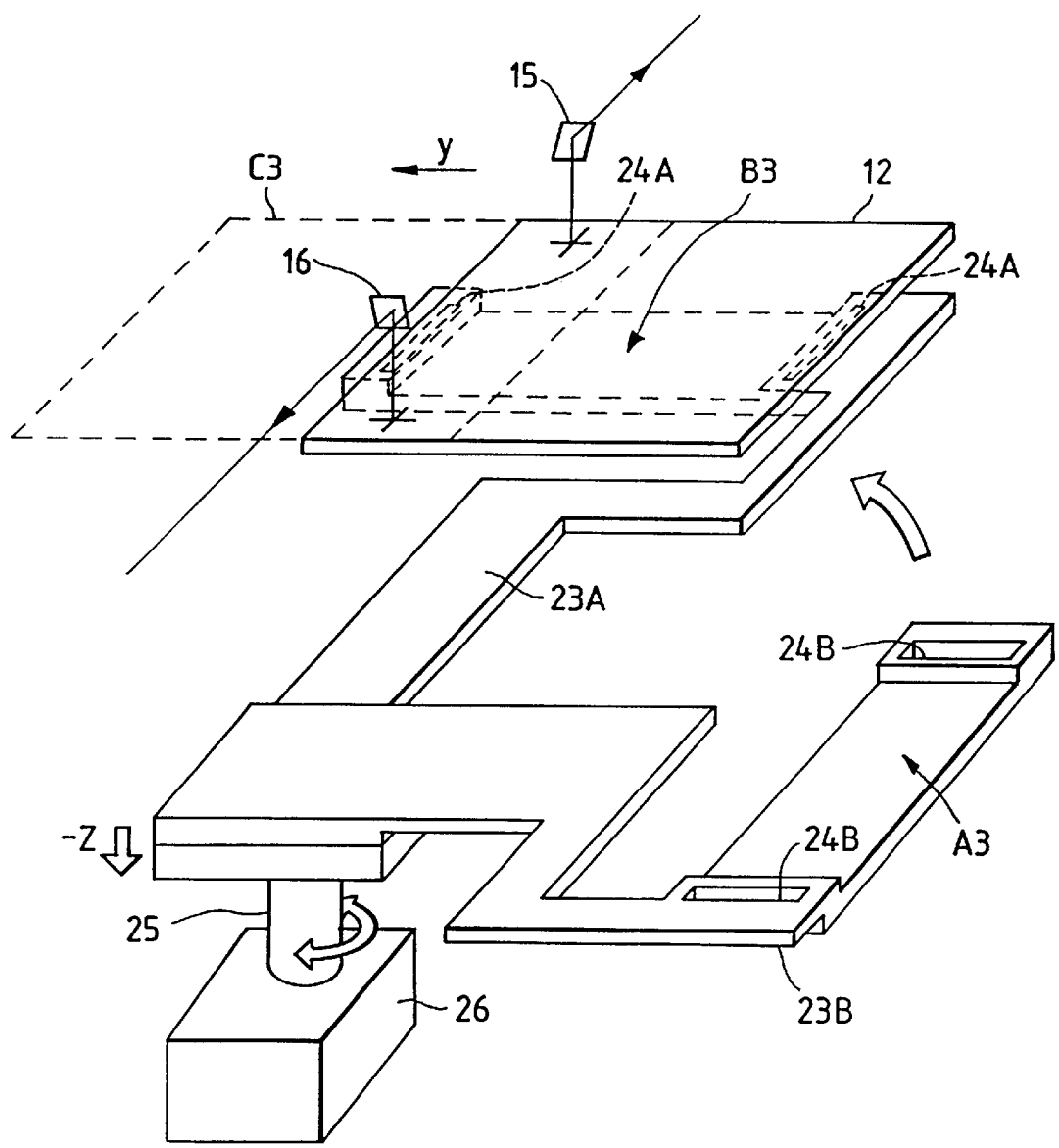
FIG. 3 is a perspective view showing a reticle loader system.

A projection exposure method according to a first embodiment of the present invention is now described with reference to the drawings. This embodiment is when the present invention is applied to a case where patterns on the reticle are exposed on a wafer by using a projection type exposure apparatus of a slit scanning exposure type.

FIG. 1 shows a projection type exposure apparatus according to this embodiment. In FIG. 1, patterns on a reticle 12 are illuminated through an illumination area (hereinafter, referred to as a "slit-shaped illumination area") of a rectangular shape formed by an exposing light EL from an illuminating optical system which is not shown in the figure. Images of the patterns are projected and exposed on a wafer 5 through a projection optical system 8. In this event, the wafer 5 is scanned backward from the perspective to the surface of FIG. 1 at a constant velocity V/M (where 1/M is a reduction magnification of the projection optical system 8) in synchronism with the scanning of the reticle 12 forward from the perspective of the surface of FIG. 1 at the constant velocity of V relative to the slit-shaped illumination area of the exposing light EL.

Described is a driving system for the reticle 12 and the wafer 5. A reticle Y-driving stage 10 is mounted on a reticle supporting platform 9. The reticle Y-driving stage 10 is drivable in a direction of a Y axis (a direction perpendicular to the paper surface of FIG. 1). A reticle fine driving stage 11 is mounted on the reticle Y-direction driving stage 10. The reticle 12 is held by a vacuum chuck or the like on the reticle fine driving stage 11. The reticle fine driving stage 11 controls a position of the reticle 12 slightly with a high accuracy in an X direction parallel to the paper surface of FIG. 1, Y direction and a rotation direction (θ direction) within a plane orthogonal to the optical axis of the projection optical system 8. A movable mirror 21 is disposed on the reticle fine driving stage 11. Positions of the reticle fine driving stage 11 are monitored continuously in the X, Y and θ directions through an interferometer 14 disposed on the reticle supporting platform 9. Position information S1 obtained by the interferometer 14 is supplied to a main control system 22A.

A wafer Y-axis driving stage 2 is mounted on a wafer supporting platform 1. The wafer Y-axis driving stage 2 is drivable in a direction of the Y-axis. A wafer X-axis driving stage 3 is mounted on the wafer Y-axis driving stage 2. The wafer X-axis driving stage 3 is drivable in a direction of an X-axis. A Zθ-axis driving stage 4 is so disposed on the wafer X-axis driving state 3 that is drivable in at least the rotation direction. The wafer 5 is held on the Zθ-axis driving stage 4 by vacuum. A movable mirror 7 is secured to the Zθ-axis driving stage 4. Positions of the Zθ-axis driving stage 4 are monitored in the X, Y and θ directions through an interferometer 13 arranged outside. Position information obtained by the interferometer 13 is also supplied to the main control system 22A. The main control system 22A controls positioning operation, through a wafer driving device 22B or the like, the wafer Y-axis driving stage 2, the wafer X-axis driving stage 3 and the Zθ-axis driving stage 4 and controls the operation of the entire device.

As will be described later, a reference mark plate 6 is secured to the surface of the Zθ-axis driving stage 4 at a position close to the wafer 5 to align a wafer coordinate system and a reticle coordinate system. The wafer coordinate system is defined by a coordinate measured by the interferometer 13 at the wafer side. The reticle coordinate system is defined by a coordinate measured by the interferometer 14 at the reticle side. Various reference marks are formed on the reference mark plate 6 as will be described later. Some of these reference marks (luminous reference marks) are illuminated from the backside (from the side of the Zθ-axis driving stage 4) by an illumination light led to the Zθ-axis driving stage 4 side.

Reticle alignment microscopes 19 and 20 are provided over the reticle 12 of this embodiment to observe the reference marks on the reference mark plate 6 and the marks on the reticle 12 simultaneously. In such a case, deflection mirrors 15 and 16 are movably disposed to lead the detection light supplied from the reticle 12 to the reticle alignment microscopes 19 and 20, respectively. When an alignment sequence begins, the deflection mirrors 15 and 16 are withdrawn by mirror driving devices 17 and 18 in response to a command supplied from the main control system 22A. An alignment device 34 of the off-axis type is also provided at a Y-direction side of the projection optical system 8 to observe the alignment marks (wafer marks) on the wafer 5.

A keyboard 22C is connected to the main control system 22A, allowing an operator to enter commands. The projection aligner according to this embodiment has a quick mode for measuring quickly the base line amount or the like along with a mode for measuring the same with a high accuracy as will be described below. An operator indicates that the mode to be executed is whether the high accuracy mode or the quick mode through the keyboard 22C to the main control system 22A.

Next, described with reference to flow charts in FIGS. 2A and 2B is an operational sequence from loading to the wafer 5 and reticle 12 to completion of the alignment in the projection type exposure apparatus according to this embodiment. First, at step 101 in FIG. 2A, reticle 12 is subjected to prealignment based on external form reference on a reticle loader (described below).

FIG. 3 shows a reticle loader system for use in carrying the reticle 12 to the reticle fine driving stage 11 shown in FIG. 1. The reticle loader in FIG. 3 comprises two reticle arms 23A and 23B, an arm rotation axis 25 connected to the reticle arms 23A and 23B, and a rotation mechanism 26 for rotating the arm rotation axis 25. Grooves 24A and 24B for vacuuming are formed in a reticle mounting surface of the reticle arms 23A and 23B, respectively. The reticle arms 23A and 23B are so supported that they can rotate independently of each other through the arm rotation axis 25.

During loading of the reticle 12, the reticle 12 is passed to the reticle arm 23A through a reticle carrying mechanism (not shown) at a position A3. At that time, the other reticle arm 23B is used for carrying, for example, another reticle used during a previous process. A reticle configuration prealignment mechanism (not shown) mounted near the position A3 aligns the reticle 12 on the reticle arm 23A based on the external form thereof with a predetermined accuracy. Subsequently, the reticle 12 is subjected to vacuum suction to the reticle arm 23A. Next, at step 102 in FIG. 2A, the rotation mechanism 26 rotates the reticle arm 23A through the arm rotation axis 25 to move the reticle 12 to a position B3 in the Y direction (a ready position (passing position) of the reticle driving stage 10 in FIG. 1).

In this event, the groove 24A for vacuum suction is a groove extending in a direction orthogonal to a suction position (parallel direction of the groove 24A) on the reticle fine driving stage 11 and is located out of a pattern area of the reticle 12. Accordingly, the reticle arm 23A is allowed to advance and retract the reticle 12 freely to and from the reticle fine driving stage 11 with the reticle fine driving stage 11 moved to the topmost in the y direction or the scanning direction. When the reticle 12 arrives over the reticle fine driving stage 11 (FIG. 1), the arm rotation axis 25 retracts in a −Z direction. The reticle 12 is thus mounted on the vacuum suction surface of the reticle fine driving stage 11. After completion of passing of the reticle 12, the reticle arm 23A is withdrawn. Subsequently, the reticle fine driving stage 11 carries the reticle 12 towards a position C3. In this event, the reticle arms 23A and 23B are driven independently of each other. The reticle passing speed is increased by means of simultaneously performing loading and unloading of the reticles by these arms.

Next, at steps following step 103 the reticle 12 is aligned. A mechanism and operation therefor are described.

Figure 4A:
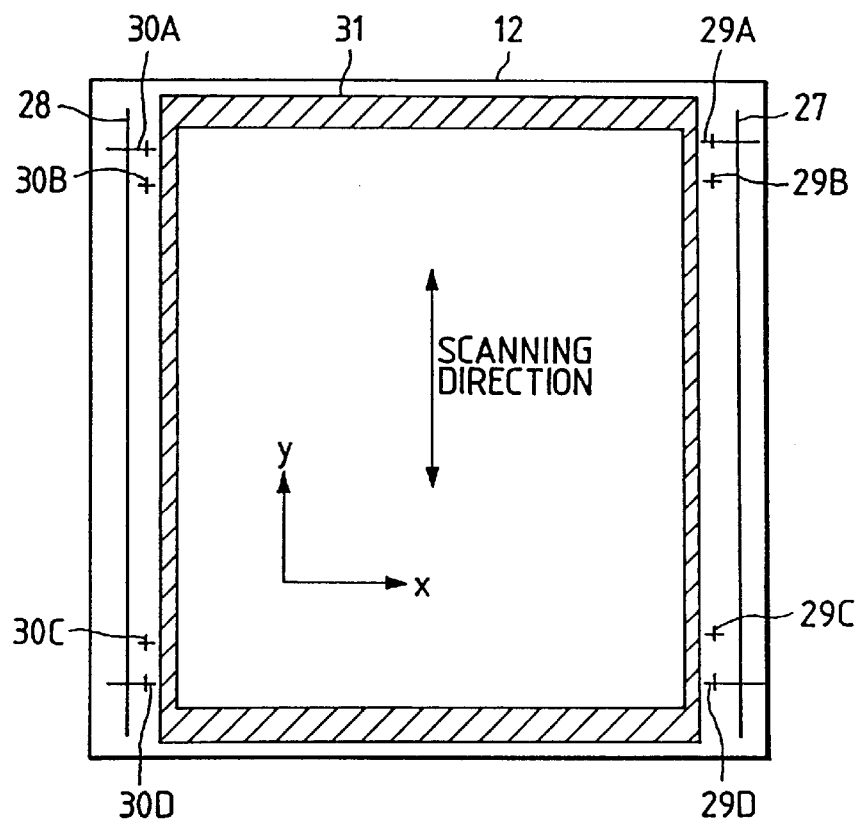
FIG. 4A is a view for use in describing an arrangement of alignment marks on a reticle.
Figure 4B:
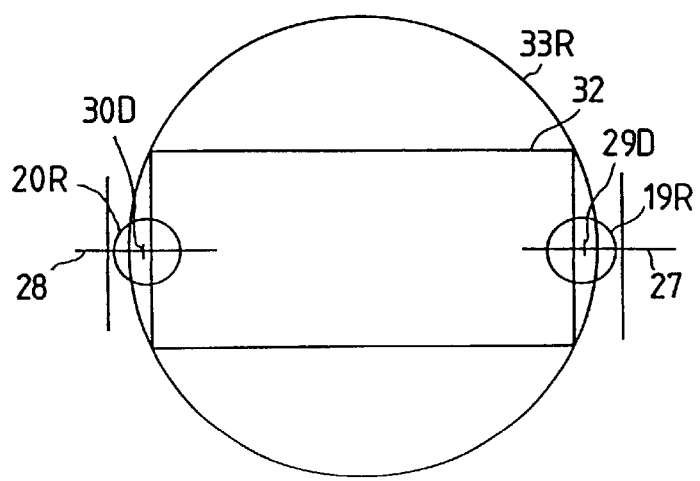
FIG. 4B is a view for use in describing an arrangement of alignment marks or the like in an area conjugated with an effective field of a projection optical system.

FIG. 4A shows arrangement of alignment marks (reticle marks) on the reticle 12. FIG. 4B shows a slit-shaped illumination area 32 or the like within an area 33R conjugated with an effective exposing field of the projection optical system over the reticle. A y direction corresponds to a scanning direction while an x direction corresponds to a direction orthogonal to the y direction. In FIG. 4A, a shield portion 31 is formed along a periphery of a pattern area at the center of the reticle 12. Reticle marks formed outside the shield portion 31 are: rough searching alignment marks 27 and 28 and fine alignment marks 29A, 29B, 29C, 29D, 30A, 30B, 30C and 30D. The rough searching alignment mark 27 at the right-hand side is formed of an elongated linear pattern and cross patterns. The linear pattern extends along the y direction or the scanning direction and the cross patterns are formed at both ends of the linear pattern. The searching alignment mark 28 at the left-hand side is formed symmetrically with the rough searching alignment mark 27 at the right-hand side.

Figure 4C:
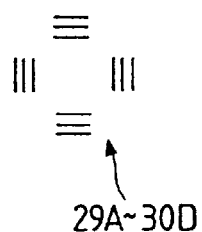
FIG. 4C is an enlarged view of fine alignment marks 29A, 29B, 29C, 29D, 30A, 30B 30C and 30D.

The fine alignment marks 29A and 29B are provided near the y direction between the shield portion 31 at the right-hand side and one cross pattern of the rough searching alignment mark 27. The fine alignment marks 29C and 29D are provided near the y direction between the shield portion 31 at the right-hand side and the other cross pattern of the rough searching alignment mark 27. The fine alignment marks 30A, 30B, 30C and 30D are formed at the left-hand side symmetrically with the fine alignment marks 29A, 29B, 29C and 29D, respectively. While each of the fine alignment marks 29A, 29B, 29C, 29D, 30A, 30B, 30C and 30D is shown as a cross mark in FIG. 4A, it is formed of two sets of three linear patterns arranged in the x direction at a predetermined distance and two sets of three linear patterns arranged in the y direction at a predetermined distance as shown in FIG. 4C. At step 103 in FIG. 2A, the rough searching alignment mark 28 at the left-hand side in FIG. 4A is detected by the reticle alignment microscope (hereinafter referred to as "RA microscope") 20. FIG. 4B shows observation areas 19R and 20R of the RA microscopes 19 and 20, respectively, on the reticle 12. During rough searching, the rough searching alignment marks 27 and 28 are located out of the observation areas 19R and 20R and also out of an area 33R conjugated with the effective exposing field. This is because the rough searching alignment marks 27 and 28 should be large enough for rough searching but the exposing field of the projection optical system is not so large, otherwise the diameter of a projection lens should be increased, resulting in increase of the costs. With this respect, procedures for performing the rough search in this embodiment is described in conjunction with FIGS. 5A and 5B.

Figure 5A:
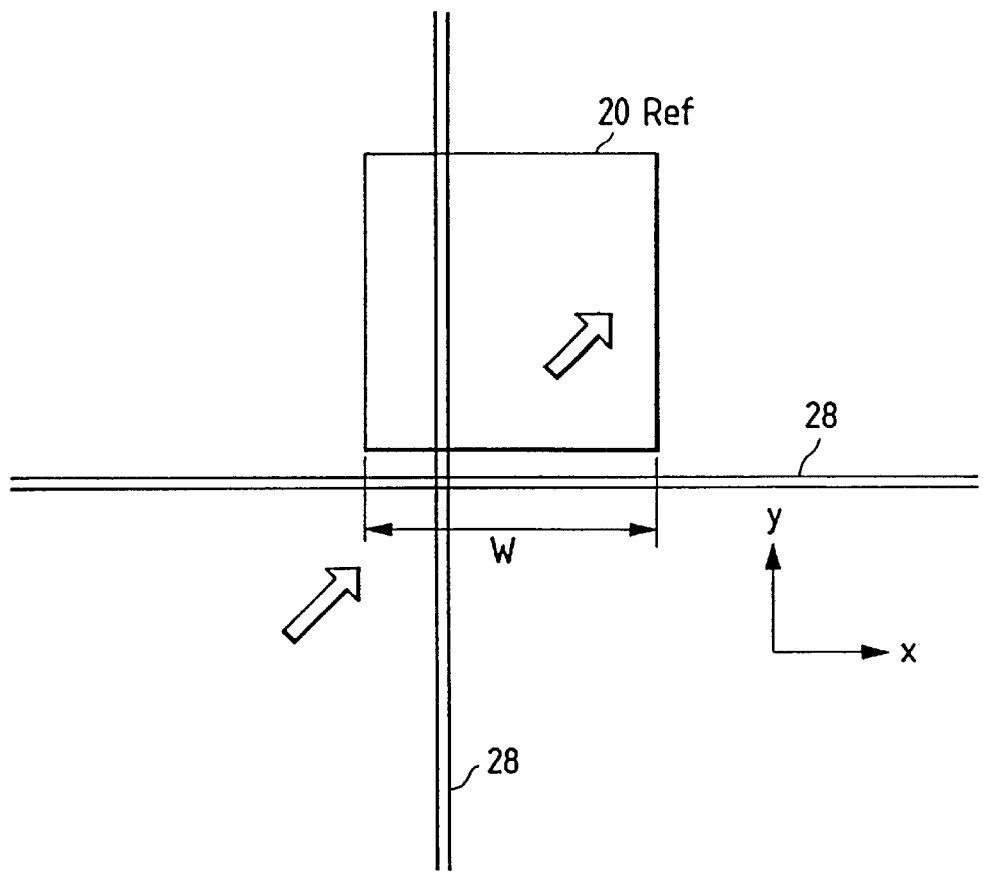
FIG. 5A is a view for use in describing how to align a reticle roughly.
Figure 5B:
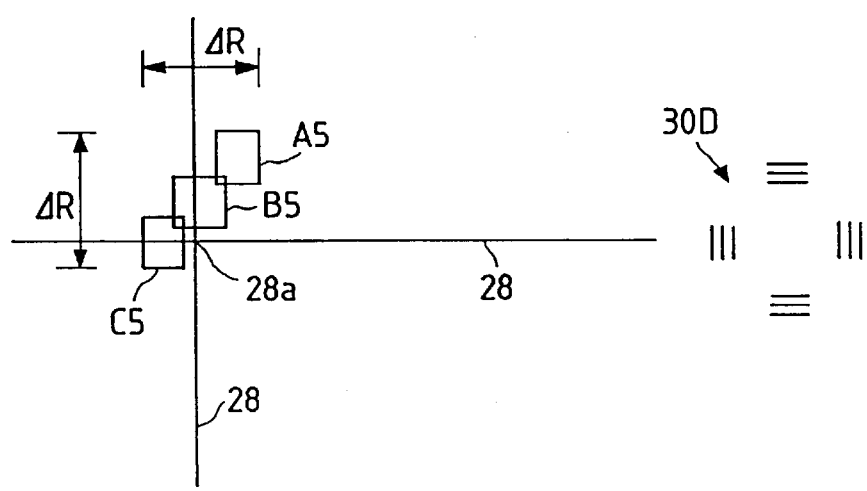
FIG. 5B is a view showing a reduced version of FIG. 5A.

FIG. 5A is an enlarged view of one cross pattern and its periphery of the rough searching alignment mark 28. FIG. 5B is a reduced version of FIG. 5A. In FIGS. 5A and 5B, W represents a width of a square effective field of view 20Ref of the RA microscope 20 and ΔR represents a designed value of a sum of a writing error and a mounting error of the patterns relative to the outer configuration of the reticle 12. Accordingly, as shown in FIG. 5B, one cross pattern 28a of the rough searching alignment mark 28 is always contained within a square area having the width of ΔR. What are to be detected are x and y coordinates of the cross pattern 28a. In this embodiment, the effective field of view 20Ref having the width of W is scanned diagonally to the x and y axes in a direction passing at 45° to two axes of the alignment mark 28. The x and y coordinates of the cross pattern 28a are obtained as the x and y coordinates at that time when the alignment mark 28 is diagonally scanned.

For this purpose, an integer portion of a positive real number is represented by INTA. The number of search fields or the least number of scanning of the square area having the width ΔR with the effective field of view 20Ref having the width W can be given by {INTA (ΔR/W)+1}. This number of search fields is previously obtained. The {INTA (ΔR/W)+ 1} effective fields of view A5, B5, C5, . . . , each having the width W are set diagonally to the square area having the width ΔR around the first effective field of view B5. The reticle fine driving stage 11 shown in FIG. 1 is driven to step the effective fields of view, thereby sampling images within each effective field of view while setting them successively within the effective field of view 20Ref in FIG. 5A.

As shown in FIG. 5B, the cross pattern 28a of the alignment mark 28 to be searched is present within a search boundary having the width and length of at least ΔR×ΔR. The alignment mark 28 is large enough to the search boundary. Accordingly, to step the effective fields of view in a diagonal direction to the alignment mark 28 makes it possible to detect the coordinates of the cross pattern 28a of the alignment mark 28 with a least number of fields. The image processing at that time may be a one-dimensional image processing on image signals obtained by means of adding the scanning lines of all lines within the picked-up image.

FIGS. 6A to 6F show image signals obtained by means of so adding the scanning lines of all lines. FIGS. 6A and 6D represent image signals obtained along the x and y directions, respectively, within the effective field of view A5 in FIG. 5B. FIGS. 6B and 6E represent image signals obtained along the x and y directions, respectively, within the effective field of view B5 in FIG. 5B. FIGS. 6C and 6F represent image signals obtained along the x and y directions, respectively, within the effective field of view C5 in FIG. 5B. The x coordinate of the cross pattern 28a is obtained from the image signal shown in FIG. 6B while the y coordinate thereof is obtained from the image signal shown in FIG. 6F.

After detecting the searching reticle mark 28 in this manner, the rough searching alignment mark 27 is moved to the observation area of the RA microscope 19 at step 104 in FIG. 2A. The position of the alignment mark 27 is detected in the same manner as described above. In this event, the portion of the reference mark plate 6 where no pattern is included is moved within the exposing field of the projection optical system 8 to illuminate the portion from the bottom. The illumination light emitted from the reference mark plate 6 allows illumination of the rough searching alignment marks 27 and 28 from the backside (Zθ-axis driving stage side).

The above mentioned sequence roughly aligns the position of the rough searching alignment marks 27 and 28 and the reticle coordinate system relative to the observation areas 19R and 20R of the RA microscopes 19 and 20 in FIG. 4B. In addition, rough alignment of the observation areas 19R and 20R of the RA microscopes with the wafer coordinate system can be made by means of measuring the reference marks on the reference mark plate 6 in FIG. 1 through the RA microscopes 19 and 20. As a result, rough alignment is completed such that the fine alignment marks 29A, 29B, 29C, 29D, 30A, 30B, 30C and 30D are not overlapped with the reference marks (described below) of the reference mark plate 6.

In this embodiment, the alignment marks on the reticle 12 are formed of the rough searching alignment marks and the fine alignment marks for the purpose of reducing the diameter of the lens of the projection optical system 8. However, the rough searching alignment marks may be used as the fine alignment marks when a lens of the larger diameter can be available. In such a case, searching can be made in the same manner on the alignment marks by means of stepping in a diagonal direction as shown in FIGS. 5A and 5B. The searching of the alignment marks can be made simultaneously through the RA microscopes 19 and 20.

Next, a sequence for fine alignment is described. Detailed structure of the wafer stage and the reticle stage is described first.

Figure 7A:
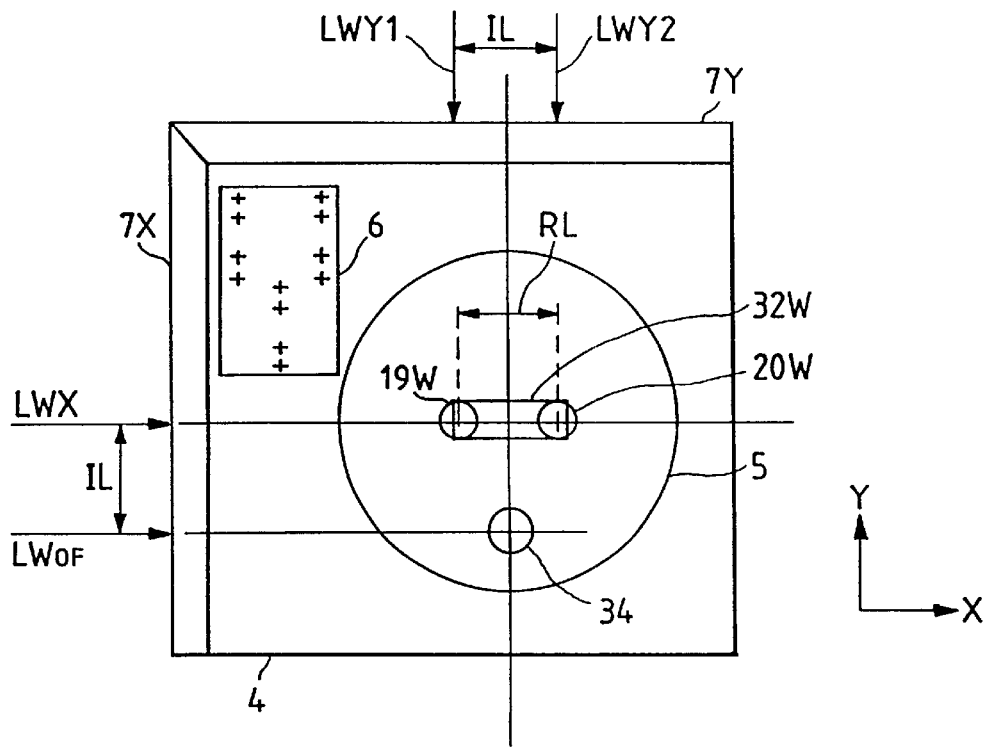
FIG. 7A is a plan view of a stage at a wafer side.

FIG. 7A is a plan view of the wafer stage. In FIG. 7A, the wafer 5 and the reference mark plate 6 are disposed on the Zθ-axis driving stage 4. Movable mirrors 7X and 7Y for the X and Y axes, respectively, are secured to the Zθ-axis driving stage 4. A slit-shaped illumination area 32W, corresponding to the slit-shaped illumination area 32 in FIG. 4B, is illuminated by an exposing light on the wafer 5. Observation areas 19W and 20W are conjugated with the observation area 19R and 20R, respectively, in FIG. 4B.

Laser beams LWX and LWof are directed to the movable mirror 7X at a distance IL in the direction parallel to the X axis along optical paths passing the optical axis of the projection optical system and a reference point of the alignment device 34, respectively. Laser beams LWY1 and LWY2 are directed to the movable mirror 7Y along optical paths parallel to the Y axis. During alignment and exposure, a coordinate value measured by an interferometer using the laser beam LWX is used as the X coordinate of the Zθ-axis driving stage 4. Used as the Y coordinate is an average $(Y_1+Y_2)/2$ of coordinate values $Y_1$ and $Y_2$ measured by interferometers using the laser beams LWY1 and LWY2, respectively. For example, the rotation amount in the rotation direction (θ direction) of the Zθ-axis driving stage 4 can be measured according to the difference between the coordinate values $Y_1$ and $Y_2$. The position and a rotation amount within an XY plane of the Zθ-axis driving stage 4 is controlled according to these coordinates.

In particular, for the Y direction or the scanning direction, an error due to air fluctuation or the like during scanning is relieved using an averaging effect by means of applying the average value of the measured results obtained by two interferometers. When the alignment device 34 of the off-axis type is used, the position in the X-axis direction is so controlled as not to cause a so-called Abbe's error according to measured values of an exclusive interferometer using the laser beam LW$_{of}$.

Figure 7B:
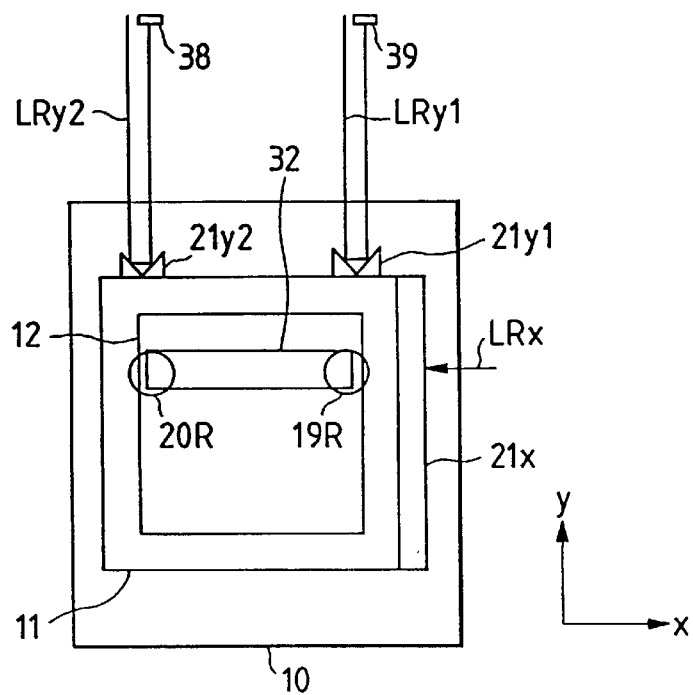
FIG. 7B is a plan view of a stage at a reticle side.

FIG. 7B is a plan view of the reticle stage. In FIG. 7B, the reticle fine driving stage 11 is mounted on the reticle Y-axis driving stage 10, on which the reticle 12 is held. A movable mirror 21x for the x axis and two movable mirrors 21y1 and 21y2 for the y axis are secured to the reticle fine driving stage 11. A laser beam LRx is directed to the movable mirror 21x in parallel with the x axis. Laser beams LRy1 and LRy2 are directed to the movable mirrors 21y1 and 21y2, respectively, in parallel with the y axis.

As in the case of the wafer stage, a coordinate in the y direction of the reticle fine driving stage 11 is an average value of (y1+y2)/2 of coordinates Y1 and y2 measured by two interferometers using the laser beams LRy1 and LRy2, respectively. A coordinate in the x direction is a coordinate value measured by an interferometer using the laser beam LRx. The rotation amount in a direction (θ direction) of the reticle fine driving stage 11 is measured according to the difference between, for example, the coordinate values Y1 and y2.

In this event, corner-cube reflector elements are used as the movable mirrors 21y1 and 21y2 in the y direction or the scanning direction. The laser beams LRy1 and LRy2 reflected from the movable mirrors 21y1 and 21y2 are in turn reflected back from reflection mirrors 39 and 38, respectively. More specifically, the interferometer for the reticle is a double-path interferometer. Accordingly, rotation of the reticle fine driving stage 11 does not shift or displace the position of the laser beams. As in the case of the wafer stage, the reticle 12 is provided with the slit-shaped illumination area 32 and the observation areas 19R and 20R of the RA microscopes 19 and 20, respectively. The Zθ-axis driving stage 4 in FIG. 7A and the reticle 12 can be observed only through the observation areas 19R and 20R. A relation between the reticle 12 and the Zθ-axis driving stage 4 is so measured as to improve the rotation accuracy of the reticle 12 and the wafer 5 as well as the alignment accuracy on exposing. A method thereof is described in conjunction with FIGS. 8A, 8B, 8C, 8D, 8E and 9.

Figure 8A:
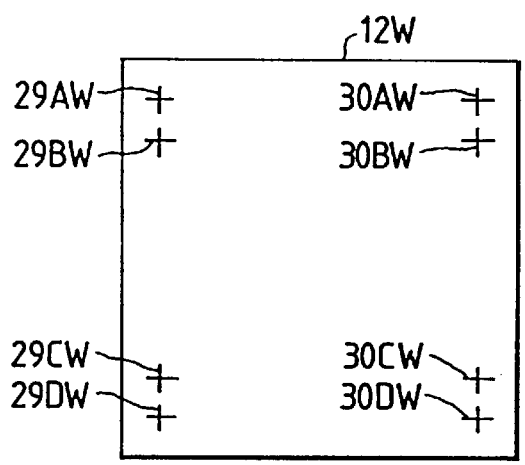
FIG. 8A is a projection view showing arrangement of marks on the reticle.
Figure 8B:
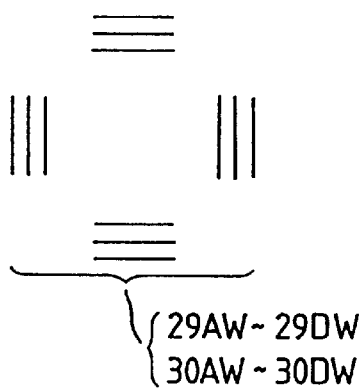
FIG. 8B is an enlarged projection view showing an example of marks on the reticle.

FIG. 8A shows an reticle image 12W obtained by means of projecting the reticle 12 to the reference mark plate 6 in FIG. 7A. In FIG. 8A, shown are mark images 29AW, 29BW, 29CW and 29DW conjugated with the fine alignment marks 29A, 29B, 29C and 29D, respectively, in FIG. 4A and mark images 30AW, 30BW, 30CW and 30DW conjugated with the fine alignment marks 30A, 30B, 30C and 30D, respectively. Each of the mark images 29AW, 29BW, 29CW, 29DW, 30AW, 30BW, 30CW and 30DW is formed of four sides each comprising three linear patterns as shown in FIG. 8B.

Figure 8C:
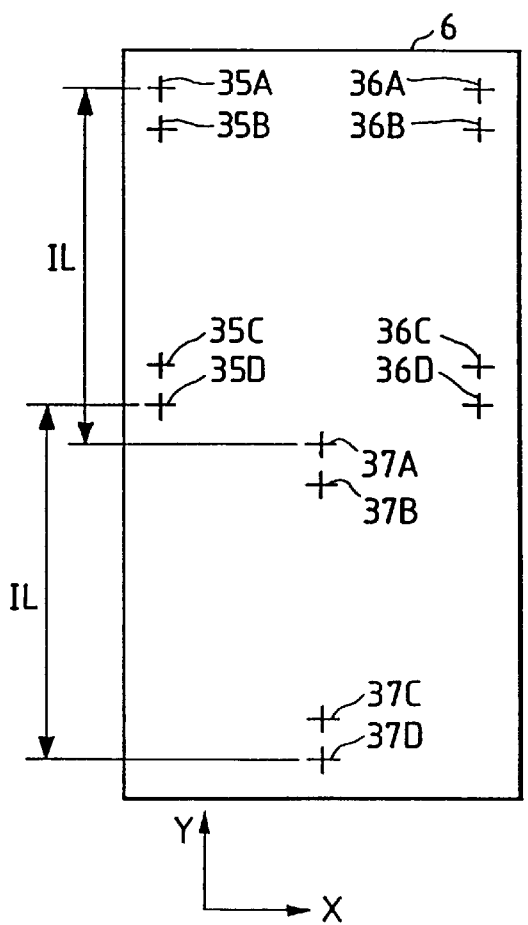
FIG. 8C is a plan view showing arrangement of the reference marks on a reference mark plate 6.

FIG. 8C shows arrangement of reference marks on the reference mark plate 6. Formed on the reference mark plate 6 in FIG. 8C are reference marks 35A, 35B, 35C, 35D, 36A, 36B, 36C and 36D arranged in a manner similar to the mark images 29AW, 29BW, 29CW, 29DW, 30AW, 30BW, 30CW and 30DW in FIG. 8A. These reference marks are illuminated by an illumination light that is equal in wavelength to the exposing light. A reference mark 37A is also provided on the reference mark plate 6 at a position away from a center between the reference marks 35A and 36A at a distance IL in the Y direction or the scanning direction. The distance IL corresponds to the base line amount, the distance between the reference point of the projection optical system 8 in FIG. 1 and the reference point of the alignment device 34 of the off-axis type. Likewise, reference marks 37B, 37C and 37D are formed as positions away from centers between the reference marks 35B and 36B, between the reference marks 35C and 36C, and between the reference marks 35D and 36D, respectively, at a distance IL in the Y direction.

Figure 8D:
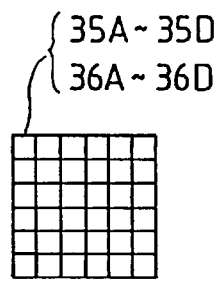
Figure 8E:
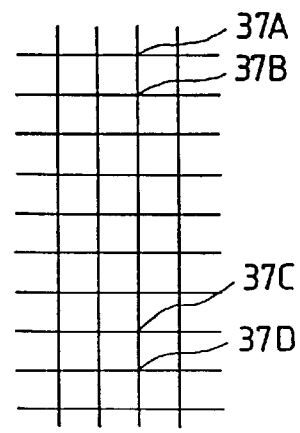

Each of the reference marks 35A, 35B, 35C, 35D, 36A, 36B, 36C and 36D is formed of linear patterns of 7-row by 7-column as shown in FIG. 8D. The reference marks 35A, 35B, 35C, 35D, 36A, 36B, 36C, and 36D have sizes smaller than the mark images 29AW, 29BW, 29CW, 29DW, 30AW, 30BW, 30CW and 30DW in FIG. 8B. The reference marks 37A, 37B, 37C and 37D are, as shown in FIG. 8E, associated lattice points of a grid pattern formed at a predetermined pitch in the X and Y directions.

In such a case, at step 105 in FIG. 2A, a relative position relation and a relative rotation angle of the reticle 12 and the RA microscopes 19 and 20 are calculated on the basis of the results obtained at the steps 103 and 104 to move the fine alignment marks 29A and 30A in FIG. 4A into the observation area 19R and 20R of the RA microscopes 19 and 20, respectively. subsequently, at step 106, the reference marks 35A and 36A on the reference mark plate 6 in FIG. 8C are moved into the observation areas 19W and 20W (see FIG. 9) conjugated with the observation areas 19R and 20R, respectively. As a result, the mark image 29AW and the reference mark 35A are observed simultaneously within the observation area 19W and the mark image 30AW and the reference mark 36A are observed simultaneously within the observation area 20W as shown in a portion depicted by 220 in FIG. 9. Subsequently, at step 107 in FIG. 2A, the images observed through the RA microscopes 19 and 20 are converted into image pick-up signals and sampled. At the same time, the detection signals of the associated reference mark images are also sampled in the alignment device 34 of the off-axis type.

Figure 9:
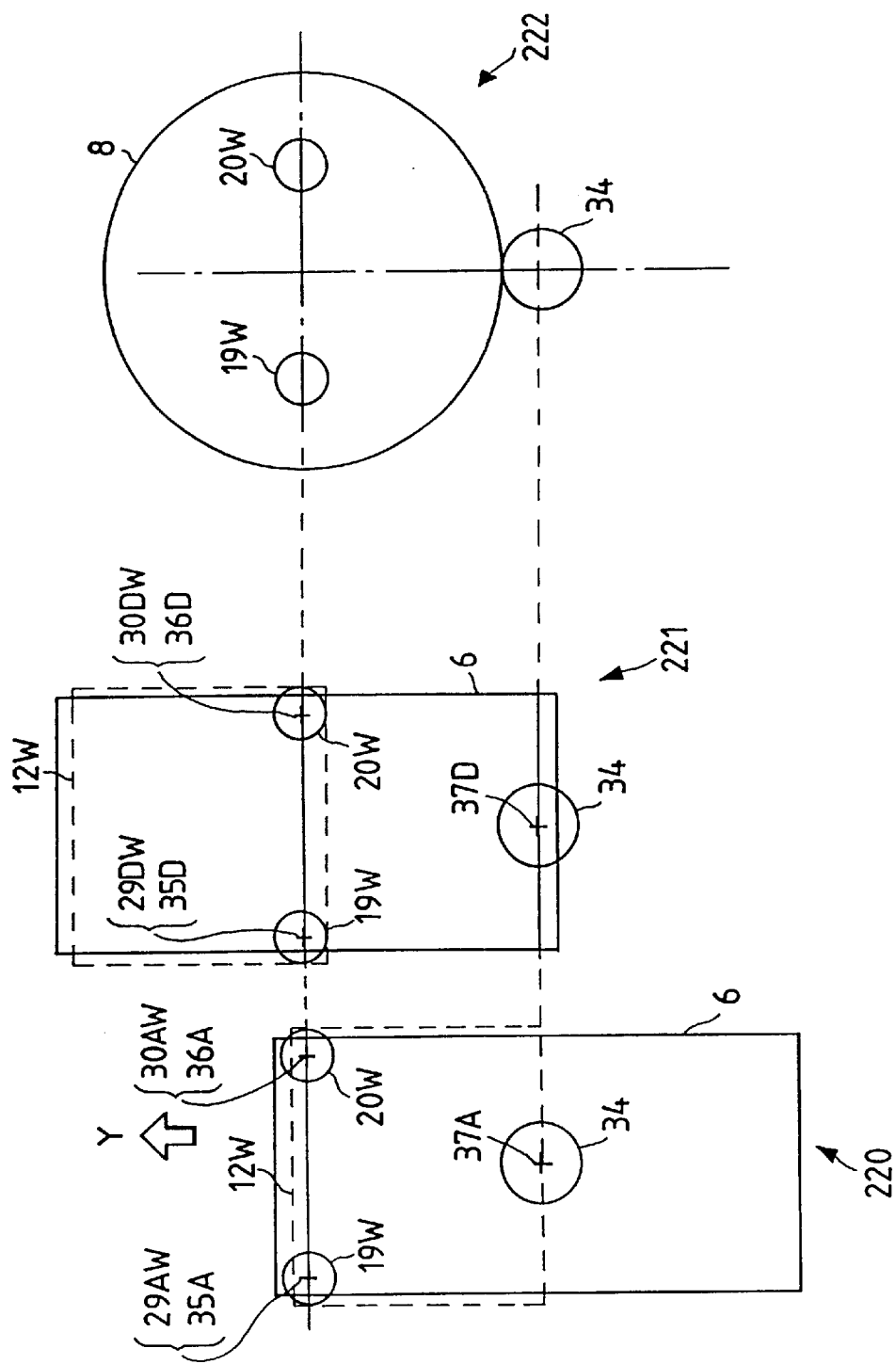
FIG. 9 is a plan view for use in describing relation among the reference mark plate, the reticle, the projection optical system and the alignment device during measurement of reticle alignment and a base line amount.

At the portion 220 in FIG. 9, the reticle image 12W or the projection image of the reticle is projected to the reference mark plate 6. As shown in a portion 222 in FIG. 9, the observation areas 19W and 20W are located at positions passing the optical axis within the exposing field of the projection optical system 8. The reference mark 37A is within the observation area of the alignment device 34 of the off-axis type. As in the case of the slit scanning exposure, the reticle fine driving stage 11 in FIG. 7B is moved downward. (to a −y direction) in synchronism with movement of the Zθ-axis driving stage 4 in FIG. 7A upward (to the Y direction). As a result, the reference mark plate 6 and the reticle image 12W are moved together to the Y direction as shown in 220 and 221 in FIG. 9. In this event, the observation areas 19W and 20W of the RA microscopes 19 and 20 and the alignment device 34 of the off-axis type are all fixed, so that from a set of marks with a symbol A (the mark images 29AW, 30AW, the reference marks 35A, 36A and 37A) to a set of marks with a symbol D (the mark images 29DW, 30DW, the reference marks 35D, 36D and 37D) are moved under the observation areas 19W and 20W and the alignment device 34.

At a first stop position after initiation of alignment shown in the portion 220 in FIG. 9, the mark image 29AW and the reference mark 35A are located under the observation area 19W. The mark image 30A and the reference mark 36A are located under the observation area 20W. The reference mark 37A is located under the alignment device 34 of the off-axis type. These marks with the symbol A are all observed at the same time. After completion of measurement at the first stop position, the reticle image 12W and the reference mark plate 6 are moved synchronously to a second stop position by the stepping operation. The set of marks observed at the first stop position under the observation areas 19W and 20W and the alignment device 34 is a set of marks with the symbol A while the set of marks present at this second stop position under the observation areas 19W and 20W and the alignment device 34 is a set of marks with a symbol B (the mark image 29BW in FIG. 8A, the reference marks 35B, 37B in FIG. 8C or the like).

By means of repeating the above mentioned sequence for third and fourth stop positions (as shown in 221 in FIG. 9), the mark image of the reticle image 12W and the reference marks on the reference mark plate 6 are measured through the RA microscopes 19 and 20 and the alignment device 34 of the off-axis type in the order of the set of marks with the symbol A, the set of marks with the symbol B, the set of marks with the symbol C and the set of marks with the symbol D. This corresponds to the operation illustrated in the steps 105 through 110 in FIGS. 2A and 2B. The so obtained measured result is clearly shown in FIG. 10.

Figure 10:
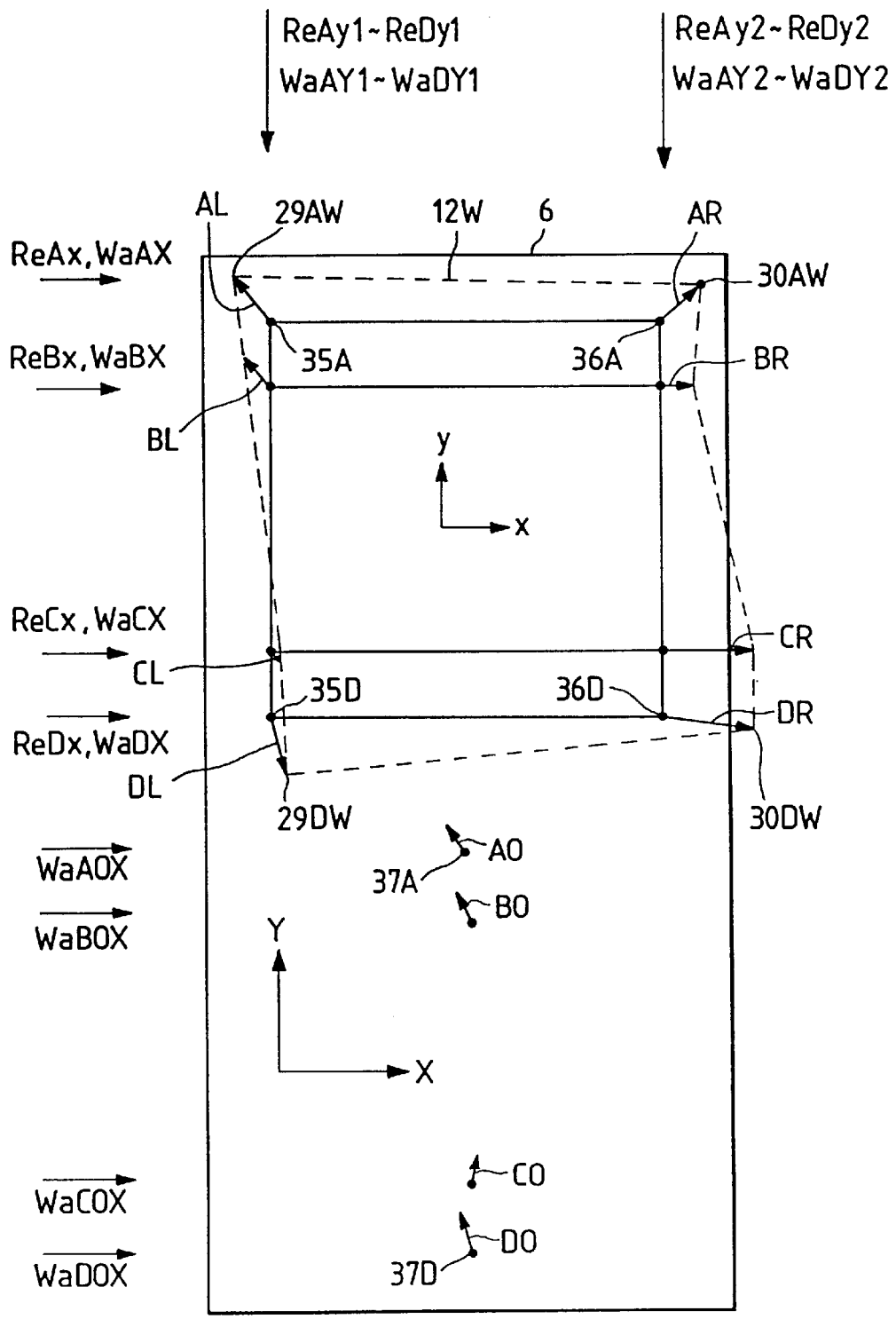
FIG. 10 is a view showing error vectors obtained by means of measuring the reticle alignment and the base line amount.

In FIG. 10, a vector of the alignment error of the reference mark 35A through the mark image 29AW is referred to as AL that is obtained by means of correcting the measured result obtained through the RA microscope 19 in the following manner. Likewise, vectors of the alignment errors of the reference marks 35B, 35C and 35D through the mark image 29BW, 29CW and 29DW are referred to as BL, CL and DL, respectively. Likewise, ΔR represents a vector of the alignment error of the reference mark 36A through the mark image 30AW. BR, CR and DR represent vectors of the alignment errors of the reference marks 36B, 36C and 36D through the mark image 30BW, 30CW and 30DW, respectively. In addition, an error vector from the reference marks 37A, 37B, 37C and 37D to the reference point of the alignment device 34 are referred to as AO, BO, CO and DO, respectively, that are obtained by means of correcting the measured result obtained through the alignment device 34 of the off-axis type in a manner described below.

ReAx, ReBx, ReCx and ReDx represent the coordinate values in the x direction measured by the interferometer 14 at the reticle side in FIG. 1, i.e., the coordinate values obtained by using the laser beam LRx in FIG. 7B when the error vectors AL, AR, BL, BR, CL, CR, DL and DR are obtained. ReAy1, ReBy1, ReCy1, ReDy1, ReAy2, ReBy2, ReCy2 and ReDy2 represent the coordinate values in the y direction measured by the interferometer 14 at the reticle side in FIG. 1, i.e., the coordinate values obtained by using the laser beams LRy1 and LRy2 in FIG. 7B when the error vectors AL, AR, BL, BR, CL, CR, DL and DR are obtained. WaAX, WaBX, WaCX and WaDX represent the coordinate values in the X direction measured by the interferometer 13 at the wafer side in FIG. 1, i.e., the coordinate values obtained by using the laser beam LWX in FIG. 7A when the error vectors AL, AR, BL, BR, CL, CR, DL and DR are obtained. WaAY1, WaBY1, WaCY1, WaDY1, WaAY2, WaBY2, WaCY2 and WaDY2 represent the coordinate values in the Y direction measured by the interferometer 13 at the reticle side in FIG. 1, i.e., the coordinate values obtained by using the laser beams LWY1 and LWY2 in FIG. 7A when the error vectors AL, AR, BL, BR, CL, CR, DL and DR are obtained.

WaAOX, WaBOX, WaCOX and WaDOX represent the coordinate values in the X direction measured by the interferometer exclusive for the alignment device of the off-axis type at the wafer side in FIG. 1, i.e., the coordinate values obtained by using the laser beam LWoF in FIG. 7A when the error vectors AO, BO, Co and DO. In this event, as shown in FIG. 7A, the distance between the laser beams LWY1 and LWY2 at the wafer side in the X direction is IL and the distance at the wafer side between the laser beams LRy1 and LRy2 at the reticle side is RL.

Next, structure of the RA microscope 19 in FIG. 1 is described in detail for use in describing how to obtain the error vector AL or the like.

Figure 11:
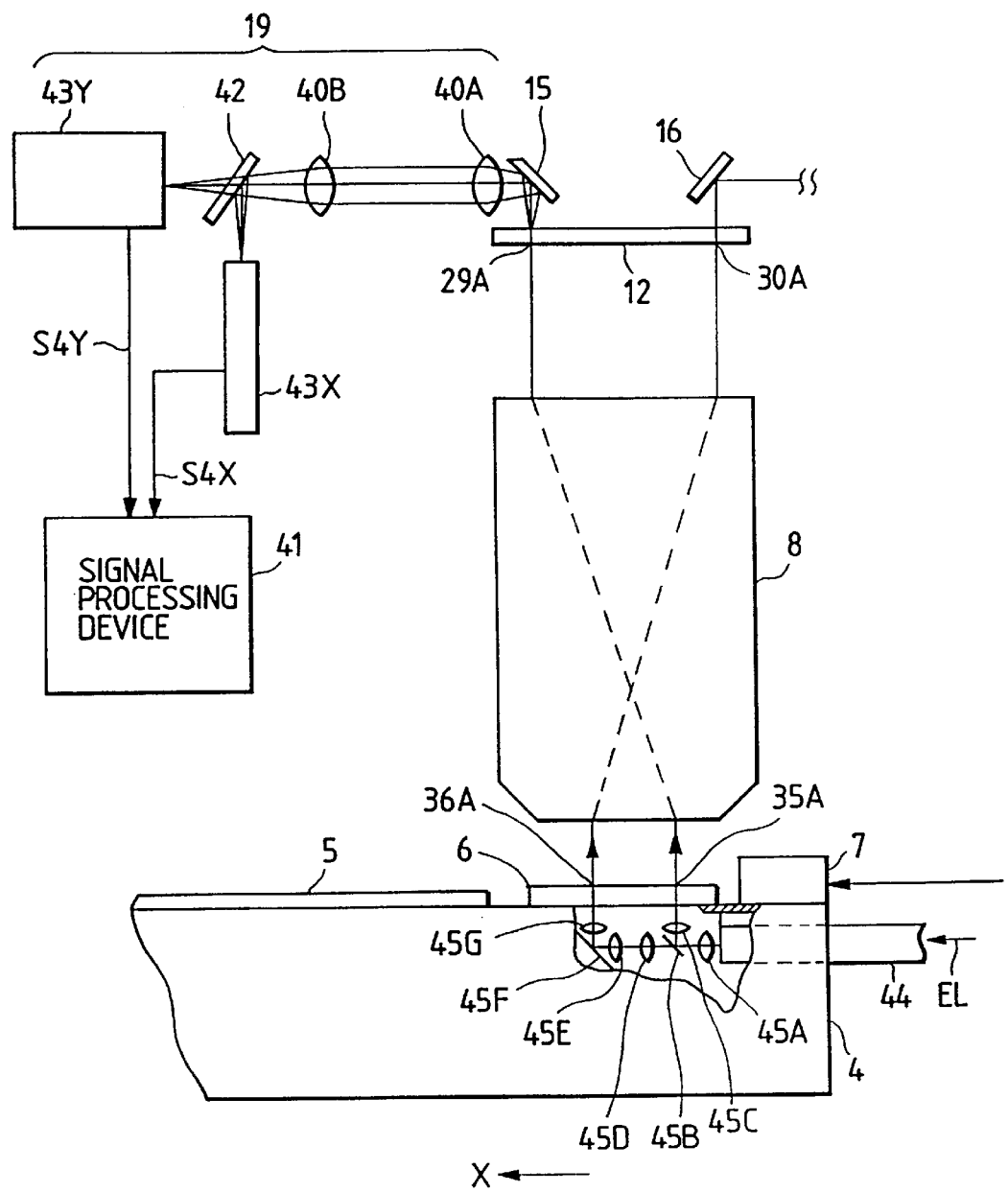
FIG. 11 is a partially cutaway structural diagram showing structure of a reticle alignment microscope 19 and an illumination system.

FIG. 11 shows the RA microscope 19 and its illumination system. In FIG. 11, an illumination light EL having the same wavelength as the exposing light is introduced into the Zθ-axis driving stage 4 from the outside of the Zθ-axis driving stage 4 through an optical fiber 44. An exposing light may be relayed through lens systems rather than using the optical fiber 44. The so introduced illumination light illuminates the reference marks 35A, 35B, 35C and 35D on the reference mark plate 6 through a lens 45A, a beam splitter 45B and a lens 45C. The illumination light transmitted through the beam splitter 45B illuminates the reference marks 36A, 36B, 36C and 36D on the reference mark plate 6 through a lens 45D, a lens 45E, a mirror 45F and a lens 45G.

Figure 12A:
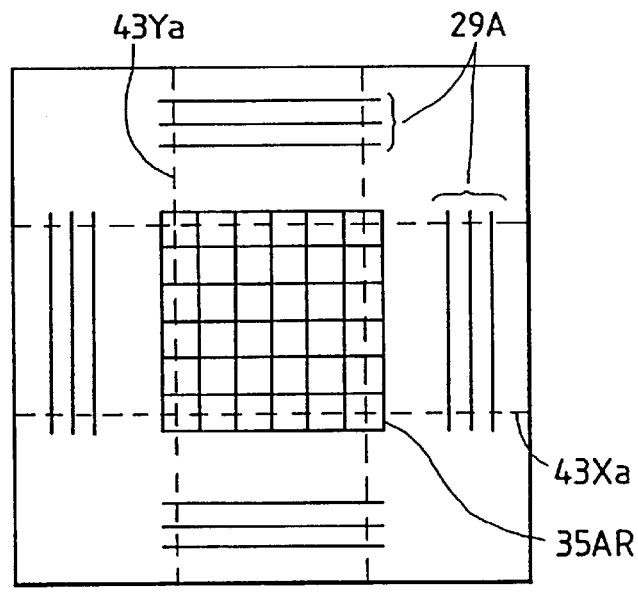
FIG. 12A is a view showing an image observed through the image pick-up device in FIG. 11.

For example, the light transmitted through the reference mark 35A focuses an image of the reference mark 35A on the file alignment mark 29A on the reticle 12. The light from the image of the reference mark 35A and the alignment mark 29A is reached to a half mirror 42 through a deflection mirror 15, a lens 40A and a lens 40B. The light divided into two-portions through the half mirror 42 are directed to image pick-up surfaces of image pick-up devices 43X and 43Y, respectively, for the X and Y axes, each of which being formed of two dimensional charged-coupled-device (CCD). The image 35AR of the reference mark 35A and the fine alignment mark 29A as shown in FIG. 12A are projected on the image pick-up devices 43Y and 43X, respectively. In this event, an image pick-up field 43X$a$ of the image pick-up device 43 for the X axis is an area parallel to the X direction of the wafer stage and the direction of the horizontal scanning lines also corresponds to the X direction. An image pick-up field 43Y$a$ of the image pick-up device 43Y for the Y axis is an area parallel to the Y direction of the wafer stage and the direction of the horizontal scanning line corresponds to the Y direction.

Accordingly, a displacement amount in the X direction between the reference mark 35A and the alignment mark 29A can be obtained according to an averaging of image pick-up signals S4X obtained by the image pick-up device 43X. A displacement amount in the Y direction between the reference mark 35A and the alignment mark 29A can be obtained according to an averaging of image pick-up signals S4Y obtained by the image pick-up device 43Y. These image pick-up signals S4X and S4Y are supplied to a signal processing device 41 (see FIG. 11).

Figure 12B:
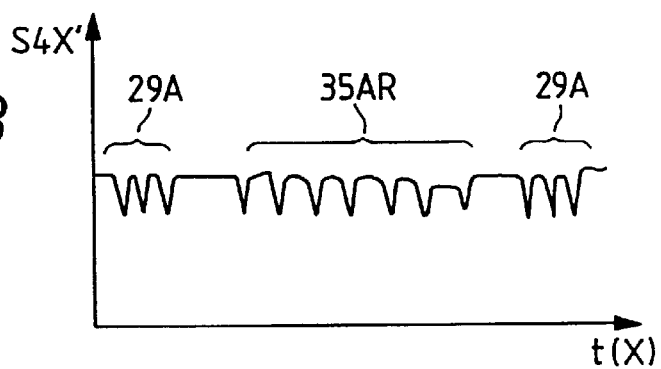
FIGS. 12B and 12C are views showing waveforms indicative of image signals in an X direction and a Y direction corresponding to the image shown in FIG. 12A.
Figure 12C:
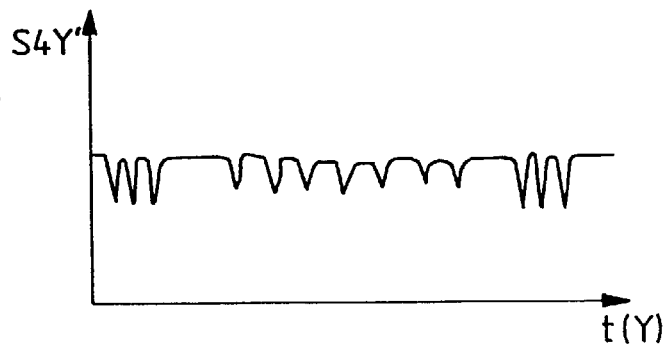

More specifically, description is made in conjunction with an exemplified case where the set of marks with the symbol A is subjected to alignment. For example, the alignment mark 29A and the reference mark 35AR shown in FIG. 12A are observed through the RA microscope 19 at the same time. In FIG. 12A, the image signals S4X and S4Y within the image pick-up fields 43X$a$ and 43Y$a$ enclosed by broken lines are detected as digital signals by means of carrying out an analog-to-digital conversion in the signal processing device 41. The image data on the individual scanning lines are averaged independently for the X and Y axes in the signal processing device 41. The averaged image signals S4X' and S4Y' for the X and Y axes, respectively, are as shown in FIGS. 12B and 12C, respectively. These image data are processed as one-dimensional image processing signals.

Calculation and processing on the so obtained signals in the signal processing device 41 produces relative displacements AL'x and AL'y in the X and Y directions between the mark image 29AW of the reticle 12 and the reference mark 35A of the reference mark plate 6 in FIG. 10. Using the RA microscope 20 in FIG. 1, obtained are relative displacements AR'x and AR'y in the X and Y directions between the mark image 30AW and the reference mark 36A. Likewise, obtained are relative displacements between the mark images 29BW, 29CW and 29DW and the reference marks 35B, 35C and 35D, respectively, in FIG. 10 and relative displacements between the mark images 30BW, 30CW and 30DW and the reference marks 36B, 36C and 36D, respectively.

However, the image signal corresponding to the alignment mark 29A and the image signal corresponding to the reference mark image 35AR in FIG. 12B are controlled in position by the interferometer at the reticle side and the interferometer at the wafer side, respectively. Accordingly, measurement errors (=measured value−set value), $\Delta ReAx$, $\Delta ReAy1$, $\Delta ReAy2$, $\Delta WaAX$, $\Delta WaAY1$, and $\Delta WaAY2$ are caused due to following errors at the individual stages with respect to the measured coordinates ReAx, ReAy1 and ReAy2 obtained by the interferometer at the reticle side and the measured coordinates WaAX, WaAY1 and WaAY2 obtained by the interferometer at the wafer side during measurement of the set of marks with the symbol A (29AW, 35A, 30AW and 36A in FIG. 10). These measurement errors are contained in the relative displacements AL'x and AL'y obtained through the calculation.

With this respect, the results obtained by means of subtracting the errors from the relative displacements obtained through measurement correspond to an X component ALx and a Y component ALy of the vector of the alignment error in FIG. 10. In this event, (1/M) in a following equation represents a reduction magnification of the projection optical system 8, while IL and RL represent the distances described in conjunction with FIG. 7A.

$$ALx = AL'x - \Delta ReAx/M - \Delta WaAX \quad \text{(Equation 1)},$$

and $$ALy = AL'y - \Delta ReAy1/M - \{(\Delta WaAY1 + \Delta WaAY2)/2 - (\Delta WaAY2 - \Delta WaAY1) \cdot RL/IL\} \quad \text{(Equation 2)}.$$

Likewise, an X component ARx and a component ARy of the vector AR of the alignment error in FIG. 10 can be given by following equations.

$$ARx = AR'x - \Delta ReAx/M - \Delta WaAX \quad \text{(Equation 3)},$$

and $$ARy = AR'y - \Delta ReAy2/M - \{(\Delta WaAY1 + \Delta WaAY2)/2 - (\Delta WaAY2 - \Delta WaAY1) \times RL/IL\} \quad \text{(Equation 4)}.$$

Figure 13:
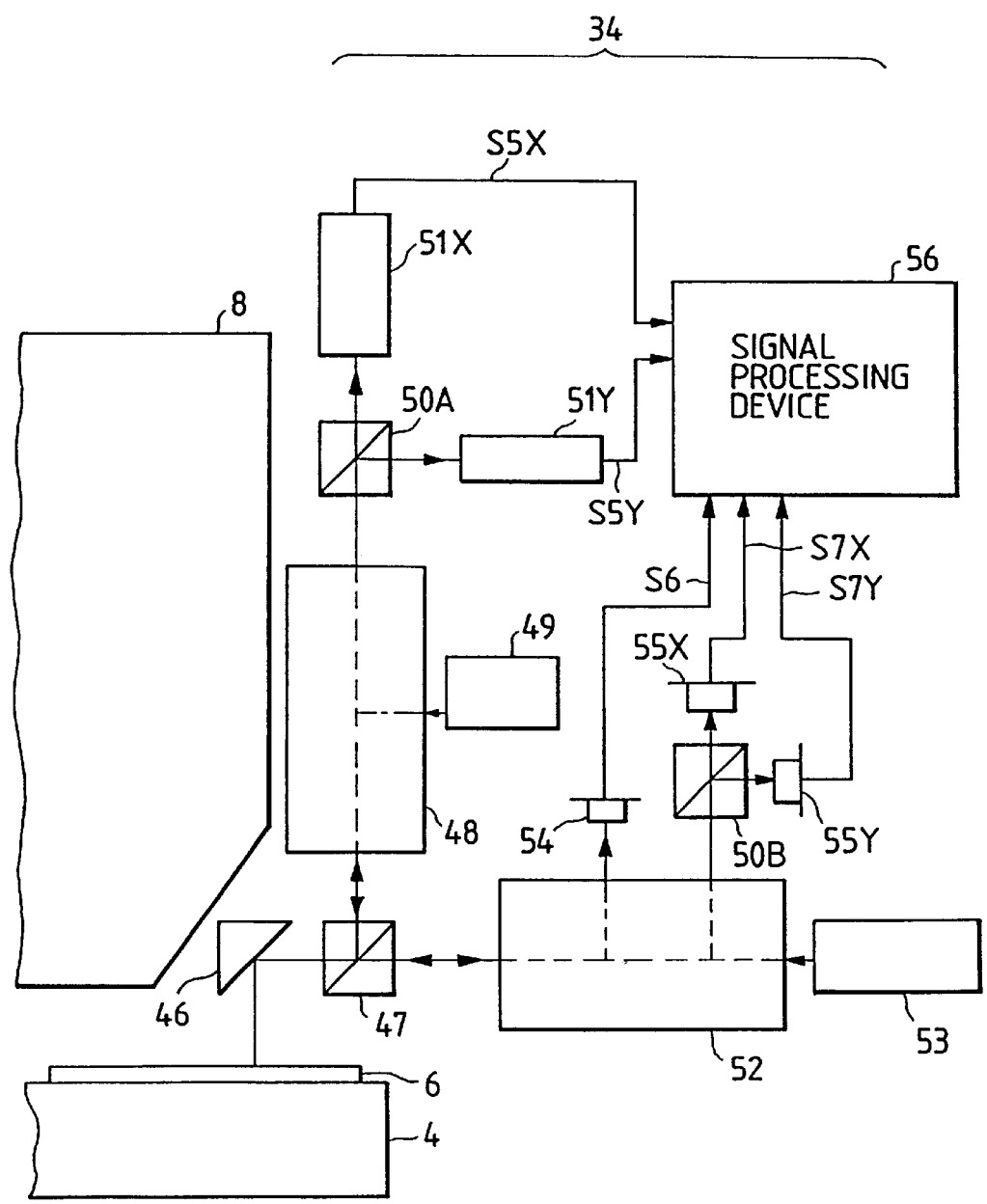
FIG. 13 is a structural diagram showing an alignment device 34 of an off-axis type.

Next, structure of the alignment device 34 is described in conjunction with FIG. 13 for use in describing the error vectors AO, BO, CO and DO in FIG. 10 obtained by means of correcting the results obtained by the alignment device 34 of the off-axis type.

FIG. 13 shows structure of the alignment device 34. In FIG. 13, the light from the reference mark on the reference mark plate 6 is deflected from a deflection mirror unit 46 and is directed to a half prism 47. The light reflected from the half prism 47 is directed to an alignment optical system 48 (hereinafter, referred to as "FIA optical system") of an image processing type using white light. The light transmitted through the half mirror is directed to an alignment optical system 52 (hereinafter, referred to as "LIA optical system") for use in detecting the diffraction light from lattice marks using a heterodyne beam.

Describing about the FIA optical system 48, the illumination light from an illumination light source 49 is passed through the FIA optical system 48 and is deflected through the half prism 47 and the deflection mirror 46 to illuminate the reference marks on the reference mark plate 6. The back light therefrom goes back to the FIA optical system through the same optical path. The light transmitted through the FIA optical system is directed to a half prism 50A. The light beam transmitted through the half prism 50A focuses an image of the reference mark of the reference mark plate 6 on the image pick-up surface of an image pick-up device 51X for the X axis formed of a two-dimensional CCD. The light beam reflected from the half prism 50A focuses an image of the reference mark of the reference mark plate 6 on the image pick-up surface of an image pick-up device 51Y for the Y axis formed of a two-dimensional CCD.

Figure 14A:
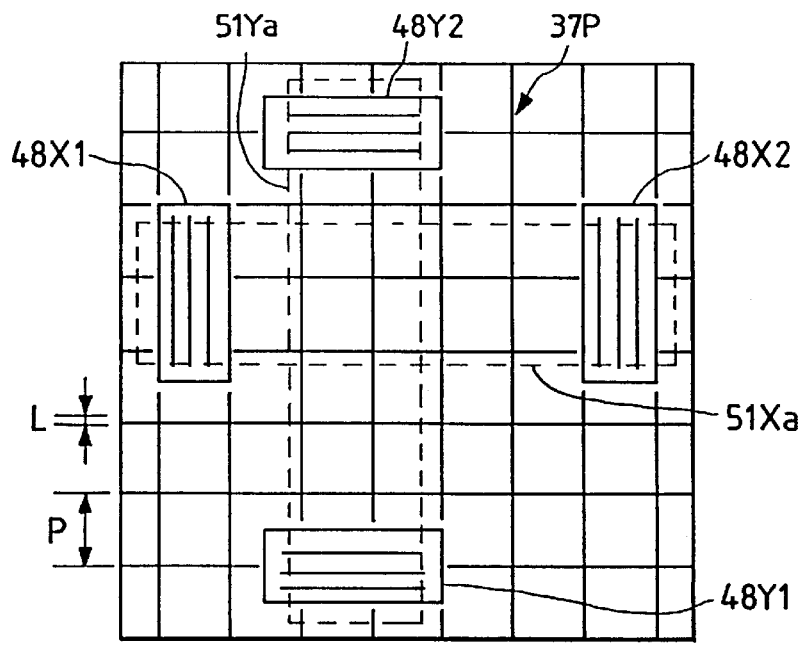
FIG. 14A is a view showing an image observed through the image pick-up device in FIG. 13.

On the image pick-up surfaces of the image pick-up devices 51X and 51Y, images shown in FIG. 14A are focused. The reference marks on the reference mark plate 6 are grating points of the grating pattern. FIG. 14A shows an image 37P of the grating pattern. It is assumed that P and L represent grating pitch on the reference mark plate 6 of the image 37P of the grating pattern and a width of a dark line, respectively, the width L is significantly smaller than the pitch P. Focused on the image pick-up surface are reference mark (index mark) images 48X1 and 48X2 in the X direction and index mark images 48Y1 and 48Y2 in the Y direction illuminated by another illumination light other than the illumination light for the reference mark plate 6. The position of the reference marks on the reference mark plate 6 can be detected with the position of the index marks as the reference.

Figure 14B:
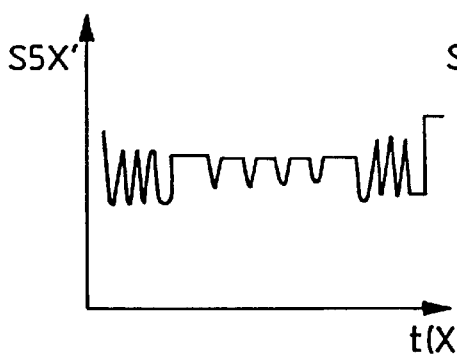
FIGS. 14B and 14C are views showing waveforms indicative of image signals in an X direction and a Y direction corresponding to the image shown in FIG. 14A.
Figure 14C:
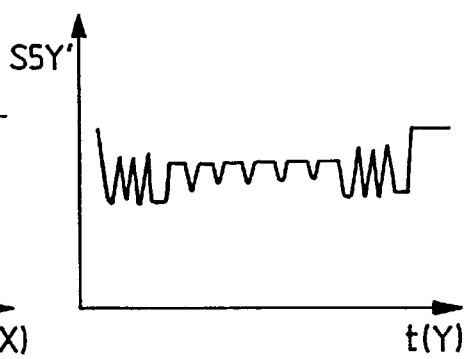

More specifically, image pick-up area 51Xa and 51Ya in the directions conjugated with the X and Y directions, respectively, in FIG. 14A are picked up through the image pick-up devices 51X and 51Y in FIG. 13. The directions of the horizontal scanning lines of the image pick-up devices 51X and 51Y are directions conjugated with the X and Y directions, respectively. Image pick-up signals S5X and S5Y obtained by the image pick-up devices 51X and 51Y, respectively, are supplied to a signal processing device 56 in FIG. 13. The signal processing device 56 averages the image pick-up signals S5X and S5Y to produce image signals S5X' and S5Y' shown in FIGS. 14B and 14C, respectively. A displacement of the directed reference mark on the reference mark plate 6 is obtained according to these image signals. More detailed structure is disclosed in Japanese Patent Application No. 4-16589.

It is assumed that relative displacements in the X and Y directions of the reference mark 37A relative to the reference mark obtained as a result of the image processing in FIG. 14A are represented by AO'fx and AO'fy when the reference mark to be detected is the reference mark 37A in FIG. 10. In this event, the position of the reference mark plate 6 is controlled on the wafer coordinate system, so that values obtained by subtracting the follow error and the rotation error of the Z$\theta$-axis driving stage 4 in FIG. 7A from the measured result are an X component $AO_X$ and a Y component $AO_Y$ of the error vector AO in FIG. 10. The X component AOx and the Y component AOy corresponding to the FIA optical system 48 in FIG. 13 are represented by AOfX and AOfY. That is, following equations are given:

$$AOfX = AO'fX - (WaAOX - WaAX) \quad \text{(Equation 5)},$$

and $$AOfY = AO'fY - (WaAY1 + WaAY2)/2 \quad \text{(Equation 6)}.$$

on the other hand, in the alignment system containing the LIA optical system 52 in FIG. 13, a laser beam emitted from a laser beam source 53 is transmitted through the LIA optical system 52 and the half prism 47, which is then deflected from the deflection mirror 46 and directed to the reference mark of a diffraction grating shape on the reference mark plate 6. The diffracted light from the reference mark goes back to the LIA optical system 52 through the same optical path. The diffracted light transmitted through the LIA optical system 52 is divided into two portions through a half prism 50B and directed to photosensitive elements 55X and 55Y for the X and Y directions, respectively.

In this event, the laser beam emitted from the laser beam source 53 in the LIA optical system 52 is divided into two portions. A frequency difference of Δf is caused between frequencies of these two laser beams by an internal frequency shifter. Interference light of these two laser beams is received by a photosensitive element 54. The photosensitive element 54 produces a reference signal S6 having a frequency of Δf. Two laser beams having different frequencies (heterodyne beams) are directed to the reference mark of the diffraction grating shape on the reference mark plate 6 at an adequate incident angle. A ±1 order diffracted light of these two laser beams from the reference mark returns in parallel in an orthogonal manner relative to the reference mark plate 6. An interference light of the ±1 order light has an intensity varied at the frequency Δf and a phase thereof varies depending on the X and Y coordinates of the reference mark. The photosensitive element 55X produces a beat signal S7X having the frequency Δf and a phase varied depending on the X coordinate of the reference mark. The photosensitive element 55Y produces a beat signal S7Y having the frequency Δf and a phase varied depending on the Y coordinate of the reference mark. The reference signal S6 and the beat signals S7X and S7Y are supplied to the signal processing device 56.

Figure 14D:
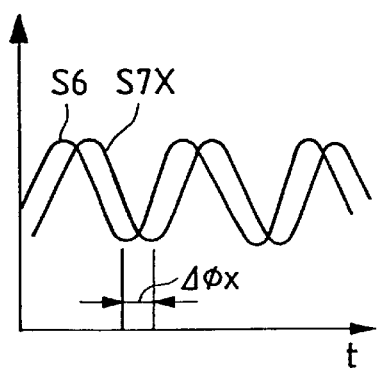
FIGS. 14D and 14E are views showing detection signals obtained through an LIA optical system shown in FIG. 13.
Figure 14E:
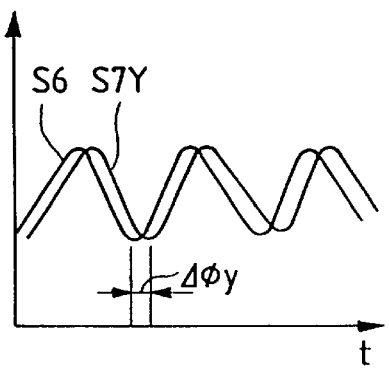

The signal processing device 56 in FIG. 13 calculates a displacement AO'LX in the X direction of the reference mark 37A according to a phase difference Δϕx between the reference signal S6 and the beat signal S7X as shown in FIG. 14D and calculates a displacement AO'LX in the Y direction of the reference mark 37A according to a phase difference Δϕy between the reference signal S6 and the beat signal S7X as shown in FIG. 14E when the reference mark to be detected is the reference mark 37A in FIG. 10. When the following error and the rotation error of the Zθ-axis driving stage 4 in FIG. 7A are subtracted from the above calculation result, the X component AOx and Y component AOy of the error vector in FIG. 10 can be obtained. Let the X and Y components $AO_X$ and $AO_Y$ of the LIA optical system 52 in FIG. 13 be $AO_{LX}$ and AOLY, respectively. That is, the following equation can be given:

$$AOLX = AO'LX - (WaAOX - WaAX) \quad \text{(Equation 7)},$$

and $$AOLY = AO'_{LY} - (WaAY1 + WaAY2)/2 \quad \text{(Equation 8)}.$$

In the above mentioned manner, eight data ALX, ALY, ARX, ARY, AOfX, AOfY, AOLX and AOLY are measured by means of performing alignment at the positions of the mark group with the symbol A in FIG. 10. Measurement on the mark groups with the symbols A through D in such a sequence produces thirty-two (=8×4) data. Of these thirty-two data, the data obtained through the RA microscopes 19 and 20 are stored as measured data Dxn, Dyn while the data obtained through the alignment device 34 of the off-axis type is stored as measured data Axn, Ayn. Subsequently, the operation proceeds step 111 in FIG. 2B. At the step 111 in FIG. 2B, it is assumed that coordinates in the x and y directions are Fxn and Fyn on a coordinate system where the reticle coordinate system and the wafer coordinate system are adapted to convert with only the linear error with respect to the measured data Dxn, Dyn corresponding to the RA microscopes 19 and 20. The following relation holds:

$$\begin{bmatrix} F_{xn} \\ F_{yn} \end{bmatrix} = \begin{bmatrix} R_x & -R_x \cdot (\omega + \theta) \\ R_y \cdot \theta & R_y \end{bmatrix} \begin{bmatrix} D_{xn} \\ D_{yn} \end{bmatrix} + \begin{bmatrix} O_x \\ O_y \end{bmatrix}. \quad \text{(Equation 9)}$$

In addition, let nonlinear errors in the x and y directions be εxn and εyn, respectively, then the following equation can be given:

$$\begin{bmatrix} \varepsilon_{xn} \\ \varepsilon_{yn} \end{bmatrix} = \begin{bmatrix} F_{xn} \\ F_{yn} \end{bmatrix} - \begin{bmatrix} D_{xn} \\ D_{yn} \end{bmatrix} \quad \text{(Equation 10)}$$

$$= \begin{bmatrix} 1 - R_x & -R_x \cdot (\omega + \theta) \\ R_y \cdot \theta & 1 - R_y \end{bmatrix} \begin{bmatrix} D_{xn} \\ D_{yn} \end{bmatrix} + \begin{bmatrix} O_x \\ O_y \end{bmatrix}.$$

Six parameters in Equation 9, Rx, Ry, θ, ω, Ox and Oy, are calculated by using the least square approximation to minimize the nonlinear error, (εxn, εyn). In this event, the scaling parameter Rx in the x direction indicates a magnification error in the x direction between the reticle 12 and the reference mark plate 6. The scaling parameter Ry indicates a scaling error in the scanning direction (y direction) between the reticle coordinate system and the wafer coordinate system. The angle parameter θ represents the rotation error between the reticle 12 and the reference mark plate 6. The angle parameter ω represents the parallelism in the scanning direction of the reticle coordinate system and the wafer coordinate system. The offset parameters Ox and Oy represent offset values in the x and y directions, respectively.

Next, at steps 112 and 113 in FIG. 2B, the base line amount is obtained. Let averages of the data Axn and Ayn measured through the alignment device 34 of the off-axis type be <Ax> and <Ay>, respectively, then the offset during measurement of the base line amount becomes (<Ax>−Ox, <Ay>−Oy). Accordingly, control should be switched during alignment from the interferometer using the laser beam LWX in FIG. 7A (hereinafter, also refereed to as "exposing interferometer LWX") to the interferometer using the laser beam LWOF (hereinafter, also referred to as "off-axis exclusive interferometer LWOF"). When the FIA optical system 48 in FIG. 13 is used, averages of the measured data Axn and Ayn are represented by <Afx> and <Afy>, respectively. Then, the offset of the offset (<Afx>−Ox, <Afy>−Oy) is taken into consideration in the measured values of the interferometer corresponding to the laser beams LWY1, LWY2 and LWOF to perform the alignment. On the other hand, when the LIA optical system 52 in FIG. 13 is used, averages of the measured data Axn and Ayn are represented by <ALx> and <ALy>, respectively. Then, the offset (<ALx>−Ox, <ALy>−Oy) is taken into consideration in the measured values of the interferometer.

According to the above, the base line amount obtained corresponds to what the base line amount (distance IL) is corrected with the offset of (<Afx>−Ox, <Afy>−Oy) or the offset of (<ALx>−Ox, <ALy>−Oy).

The above mentioned correction technique means that the reference coordinate system of the stage coordinate system is set according to the reference marks on the reference mark plate 6. In such a case, in other words, an axis passing the reference marks 37A, 37B, 37C and 37D on the reference mark plate 6 serves as a reference axis, and obtained is a read value (yawing value) of the off-axis exclusive interferometer LWOF on this reference axis with the read value of the exposing interferometer LWX of zero on this reference axis. During exposure, by using, as "values of the interferometers for delivery", the read value of the exposing interferometer LWX and the result of yawing value correction made on the read value (yawing value) of the off-axis exclusive interferometer LWOF, the positioning of the wafer 5 is performed according to these values for the delivery.

On the other hand, in FIG. 7A for example, an alternative method may be used where the movable mirror 7X for the X axis is used as the reference axis of the stage coordinate system. In such a case, in a condition shown in FIG. 7A, the read values of the exposing interferometer LWX and the off-axis exclusive interferometer LWOF are reset simultaneously (to zero), the measured values are used for the subsequent exposure without using the interferometer values for delivery. On the other hand, during alignment, obtained is an inclined angle θXF of the reference axis passing the reference marks 37A, 37B, 37C and 37D on the reference mark plate 6 relative to the movable mirror 7X. Then, such a value is used that is obtained by means of correcting with IL·θXF on the read value of the off-axis exclusive interferometer LWOF using the distance IL between the laser beams LWX and LWOF. As a result, it becomes possible to use the read values of the exposing interferometer LWX and the off-axis exclusive interferometer LWOF as they are during exposure.

Next, the measured data Dxn, Dyn represents only the relative error between the wafer coordinate system and the reticle coordinate system. Accordingly, when the least square approximation is performed using the wafer coordinate system as a reference, the obtained parameters RX, Ry, η, ω, Ox and Oy are all represented as the linear errors of the reticle coordinate system with the wafer coordinate system as the reference. With this respect, let the x and y coordinates of the reticle coordinate system be rxn' and ryn', respectively, the reticle may be driven according to a fresh coordinates (rxn', ryn') obtained, depending on the movement of the wafer coordinate system, by the following equation:

$$\begin{bmatrix} r_{xn} \\ r_{yn} \end{bmatrix} = \begin{bmatrix} R_x & -R_x \cdot (\omega + \theta) \\ R_y \cdot \theta & R_y \end{bmatrix} \begin{bmatrix} r_{xn}' \\ r_{yn}' \end{bmatrix} + \begin{bmatrix} O_x \\ O_y \end{bmatrix}.$$ (Equation 11)

In this processing, the offsets Ox and Oy has already been corrected at the reticle side, so that only the offset of (<Ax>, <Ay>) is required to be corrected as the base line amount. In addition, when the reticle coordinate system is used as the reference, the results are all reversed and correction may be made on the wafer coordinate system. These corrections may be controlled separately by means of correcting on the wafer coordinate system during the rough alignment and correcting on the reticle coordinate system during the fine alignment.

As mentioned above, according to the present invention, the reticle alignment and check of the base line amount are made during a single alignment using a plurality of marks, so that it becomes possible to average the writing error of the reticle and the positioning error between the reticle and the wafer. This improves the accuracy of alignment. In addition, these processes are simultaneously performed in parallel, improving the throughput of the operation. Further, there is no error due to the air fluctuation of the optical path of the interferometers because the reference mark plate 6 is applied that is capable of measuring the reference marks at the same time in the non-scanning direction (X direction).

However, the reference mark plate 6 moves stepwise in the scanning direction and there may be an effect of the air fluctuation. With this respect, the position of the wafer stage (Zθ-axis driving stage 4 or the like) is locked to check the reticle alignment and the base line amount by using the output values of the photosensitive devices 55X and 55Y in processing with the LIA optical system 52 in FIG. 13 for checking the base line amount. This minimizes the effect of the air fluctuation. In addition, the reticle marks in this embodiment are arranged at eight positions on the four corners of the reticle 12. This is because the parameters Rx, Ry, θ and ω are necessary as well as the offsets to check the relation between the reticle coordinate system and the wafer coordinate system and thus it is more advantageous to determine the parameters Ry, θ and ω with the marks arranged at four corners. Further, that is because, when the reference mark plate 6 used is a light emitting type, it is difficult to emit light from entire surface on the reference mark plate 6 due to limitation on a light emitting portion.

In addition, let the number of the reticle marks on the reticle 12 be n, then the offset parameters Ox and Oy are averaged into $1/n^{1/2}$, and errors in the other parameters become small. Accordingly, the more the number n of the reticle marks, the smaller the error is. A simulation result on the relation among the number n of the reticle marks, the error in the parameters and the error in the base line amount is set forth below. In the following, distribution at four corners on the fresh coordinate system of (Equation 11) is represented as three times as large as a standard deviation a with a unit of [m].

TABLE 1

| Number n of Reticle Marks Axis of | Error in RX,Ry,θ,ω | | Error in Base Line Amount | | Worse Square |
|---|---|---|---|---|---|
| Coordinates | X | Y | X | Y | Sum |
| 4 | 9.59 | 10.96 | 8.8 | 7.2 | 16.00 |
| 8 | 7.10 | 7.92 | 6.2 | 5.1 | 9.43 |
| 12 | 5.86 | 6.48 | 5.1 | 4.2 | 7.77 |
| 16 | 5.03 | 5.80 | 4.4 | 3.6 | 6.83 |

It is revealed from the above that the number n of the reticle marks being equal to eight makes it possible to ensure the check accuracy on the base line amount and the reticle alignment of 10 nm or less even when the reticle writing error is 50 nm and the stepping error of the stage is 10 nm. In other words, the higher accuracy may be achieved by means of increasing the number n of the reticle marks with the processing speed increased within the limitation of the reference mark plate 6 of the light emitting type.

In such a case, a patterning error on the reference mark plate 6 and a distortion error of the projection optical system 8 are left as the errors in the fresh coordinate system. However, there is no trouble at all when exposure results are compared with reference data in adjusting the device and the results obtained are eliminated as system offsets because these errors are hardly fluctuated.

In the above mentioned embodiment, on the reference mark plate 6 provided are a plurality of reference marks 35A, 35B, 35C and 35D and a plurality of reference marks 37A, 37B, 37C and 37D as shown in FIG. 8C. However, the corresponding relation between the reticle coordinate system and the wafer coordinate system may be obtained by means of, for example, scanning only the reticle 12 by using a single reference mark 35A and a single reference mark 37A, thereby averaging or least square approximating the measured results. This approach also contributes to reduce the effect of the writing error of the patterns on the reticle 12.

Next, a second embodiment of the present invention is described in conjunction with flow charts illustrated in FIGS. 15A, 15B and 16. As for this, the reticle alignment mode in the above mentioned first embodiment is based on the fine alignment using four pairs of fine alignment marks 29A, 29B, 29C, 29D, 30A, 30B, 30C and 30D on the reticle.

However, a single pair of fine alignment marks may be used for the reticle alignment or the base line measurement after the reticle alignment is once performed finely by means of the method described in the first embodiment if the scaling error in the scanning direction or the parallelism between the reticle coordinate system and the wafer coordinate system are small. Such an alignment mode for measuring on three items: measuring a magnification (Rx) in the non-scanning direction, measuring rotation (θ) and measuring the base line using the single pair of alignment mark is referred to as a quick mode. In this quick mode, it is necessary to store the writing error between the marks 29A and 30A obtained in the fine alignment sequence to correct the writing error between the fine alignment marks 29A and 30A.

Operation of this second embodiment is described with reference to FIGS. 15A, 15B and 16. Operation in FIGS. 15A, 15B and 16 is the operation of FIGS. 2A and 2B with the addition of the quick mode, in which switching between the fine mode and the quick mode can be available. At steps in FIGS. 15A and 15B, steps corresponding to those in FIGS. 2A and 2B are indicated by like reference numerals, and detailed description thereof will be omitted.

In FIGS. 15A and 15B, at steps 101 through 104, the reticle 12 is mounted on the reticle holder and positions of the rough searching alignment marks 27 and 28 are detected through the RA microscopes 19 and 20, respectively, as in the case of FIGS. 2A and 2B. Subsequently, either one of the fine mode or the quick mode is selected at step 115. The selected result is previously indicated by an operator through the keyboard 22C in FIG. 1. It is noted that pattern information or the like on the reticle 12 may be read by using a bar-code reader or the like which is not shown, according to which the main control system 22A may automatically select the alignment mode.

When the fine mode is selected, steps 105 through 113 are executed and the base line measurement is performed as described above by using measured result on the reticle alignment and the fine alignment using a plurality of fine alignment marks and a plurality of reference marks. At step 114, obtained is the writing error (hereinafter, referred to as "mark error") between the positions of the actual fine alignment marks 29A and 30A relative to the target positions on the fresh coordinate system on the reticle. The mark error is memorized in a memorizing unit in the main control system 22A. In calculating the mark error, the reticle coordinate system is obtained with the wafer coordinate system used as the reference according to the relation (conversion parameters) obtained at step 113. On this reticle coordinate system, the nonlinear error is obtained on the measured coordinate values relative to the coordinate values in design on the fine alignment marks 29A, 29B, 29C, 29D, 30A, 30B, 30C and 30D. This nonlinear error corresponds to the mark error. In this way, the mark error on the fresh coordinate system on the reticle is memorized according to the results obtained at steps 112 and 113. In addition, if the reticle writing error is previously measured, an operator may enter the writing error directly. When the writing error comprises a linear component, this becomes more advantageous.

On the other hand, if the quick mode is selected at the step 115, operation proceeds to step 116 in FIG. 16. At steps 116 through 118, the same operation is executed as in the steps 105 through 107 in FIG. 1. More specifically, images of a pair of fine alignment marks 30A and 29A on the reticle and a pair of reference marks 36A and 35A are observed through the RA microscopes to detect a single reference mark 37A by using the alignment device 34 of the off-axis type. In addition, at later half of step 119, the positions of the marks observed through the RA microscope and the mark detected by the alignment device 34 of the off-axis type are obtained. Subsequently, at step 119, the mark error obtained at step 114 in FIG. 15B is corrected relative to the position detected on the fine alignment marks 30A and 29A on the reticle 12. As a result, the writing error of the patterns on the reticle 12 can be corrected or compensated to the similar degree to the case of the fine alignment mode in the first embodiment even if the number of the marks measured in the quick mode is small.

Next, at step 120, the magnification error Rx in the non-scanning direction, the rotation θ and the offsets Ox, Oy are obtained of six conversion parameters (Rx, Ry, θ, ω, Ox, Oy) in Equation 9 according to the position of each mark obtained as a result of correction at the step 119. More specifically, as shown in FIGS. 8A and 8C, the magnification error Rx in the non-scanning direction is obtained from the difference between the distance between the marks in the X direction (non-scanning direction) of the measured reference marks 35A and 36A and the distance between the mark images 29A and 30A in the X direction. In addition, the rotation θ is obtained from a difference between a displacement between the reference marks 35A and 36A in the Y direction (scanning direction) and a displacement between the mark images 29A and 30A in the Y direction and the mark distance. The offsets Ox, Oy can be given according to a mean displacement between the mark images of the reference mark and the reticle mark.

In the quick mode, the number of marks to be measured is two by each at the reticle side and the reference mark plate 6 side, so that only four out of six conversion parameters in Equation 9 are determined. The four conversion parameters are thus obtained as mentioned above. A scaling error Ry in the scanning direction may be obtained by means of selecting, as the marks to be measured, two fine alignment marks 29A and 29D aligned in the Y direction in FIGS. 4A to 4C and two reference marks 35A and 35D in FIG. 8C.

The reticle alignment is performed according to the magnification error Rx in the non-scanning direction, the rotation θ and the offsets Ox and oy obtained at the step 120. The measurement of the magnification error Rx may be made by means of preparing as a table the magnification error Rx corresponding to the difference in the measured values on the marks from the designed values, thereby the magnification error Rx may be obtained with the difference between the measured values on the marks and the designed values on the marks being applied to the table.

Next, at step 121, the base line measurement is performed by using the measured values on the central coordinate of the reference marks 35A and 36A as well as the measured value on the reference mark 37A.

In this way, according to this embodiment, when the fine alignment mode is once performed to obtain the writing error (mark error) on the patterns of the reticle 12 and then the alignment is performed at the quick mode, the error is corrected, so that the alignment of the projection type exposure apparatus of the slit scanning type can be made at a high throughput and with a high accuracy.

Figure 17:
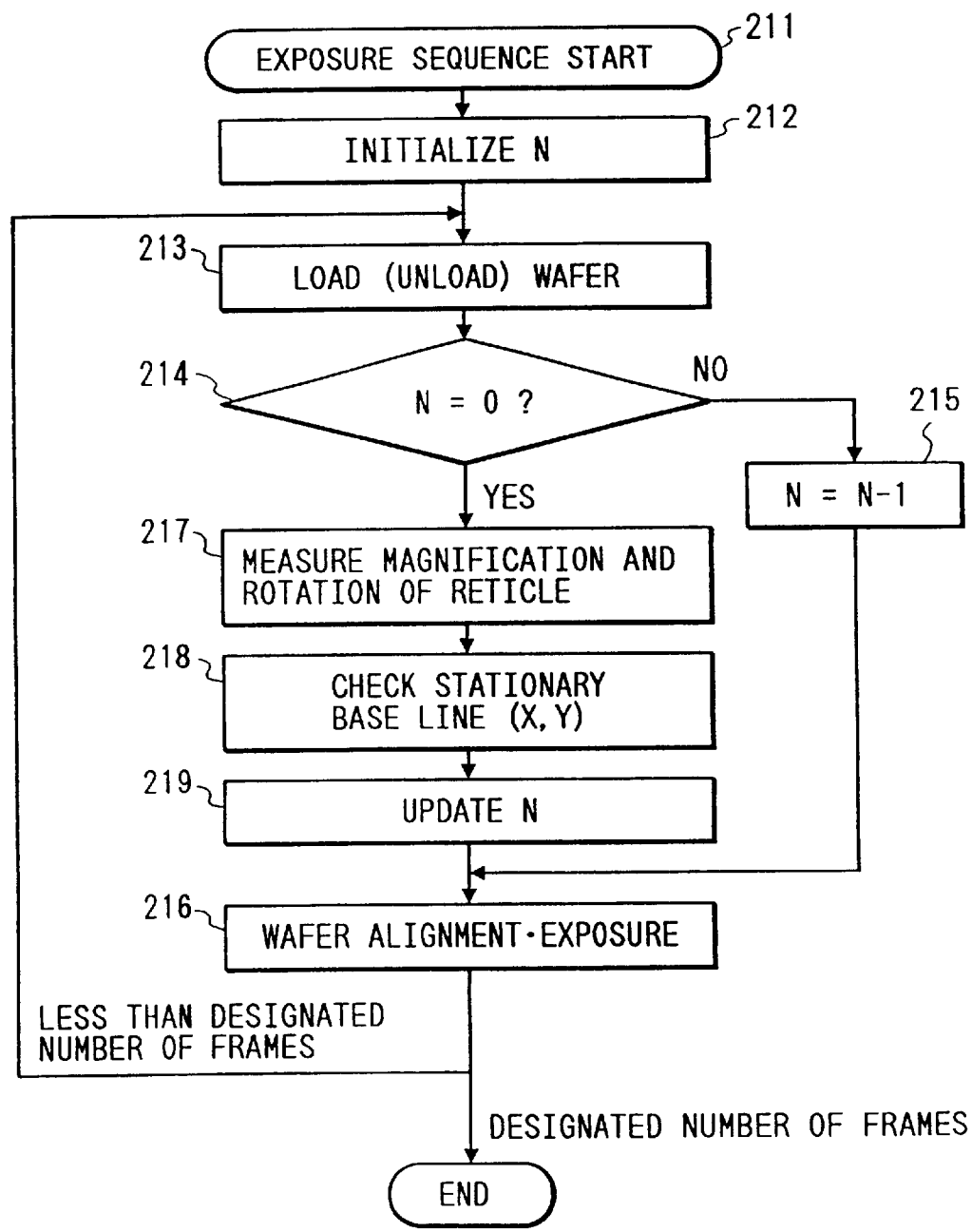
FIG. 17 is a flow chart illustrating operation of an exposure method according to a third embodiment.

Next, a third embodiment of the present invention is described in conjunction with a flow chart illustrated in FIG. 17. This third embodiment is a case where the reticle alignment and the base line measurement are performed in the above mentioned quick mode for every one replacement of a predetermined number of wafers, i.e., for every exposure of the predetermined number of wafers. In this embodiment, described with reference to FIG. 17 is an exemplified operation in a case where the reticle is exchanged in the projection type exposure apparatus in FIG. 1, following which the patterns of the reticle 12 are successively exposed on the wafers of which number is equal to, for example, 100.

First, at step 211 in FIG. 17, the previously used reticle is replaced by the reticle 12 in FIG. 1 for starting the exposing operation. In such a case, the reticle alignment and base line check operations are performed in the quick mode that are similar to those illustrated at steps 101 through 104 and 115 in FIG. 15A and steps 116 through 121 in FIG. 16. Thereafter, the number of wafers to be exposed until the next reticle alignment and the base line check is set as an initial value of a variable N at step 212. At step 213, the wafer is loaded on the wafer stage 4. When there is any wafer already exposed at step 213, the exposed wafer is first unloaded and then a new wafer is loaded.

Subsequently, at step 214, it is determined whether the variable N is equal to zero, i.e., whether the reticle alignment and the base line check should be performed at that timing. If the variable N is larger than zero, one is subtracted from the variable N at step 215 to proceed to step 216. At the step 216, the wafer is aligned by using the alignment device 34 of the off-axis type shown in FIG. 13 or the alignment system of the TTL type, following which the patterns of the reticle 12 are exposed on each shot of the wafer. After completion of exposure of all (designated number of) wafers, the exposing process on that reticle 12 is ended. If there are one or more wafers left unexposed, the step 213 is again executed to unload the exposed wafer and load a new wafer. This step is followed by the step 214.

If the variable N is equal to zero, i.e., whether the reticle alignment and the base line check should be performed at that timing at the step 214, the rotation error and the magnification error of the reticle 12 are measured at step 217. This corresponds to the step 120 in FIG. 16. Subsequently, step 218 is carried out to perform the base line check in the X and Y directions of the alignment device 34 of the off-axis type (the alignment system comprising the FIA optical system 48 or the wafer alignment system of a two-beam interference alignment type comprising the LIA optical system 52). Thereafter, the number of the wafers to be exposed until the next base line check is set as the variable N at step 219, which returns the operation to the step 216.

As mentioned above, according to this invention, the reticle alignment and the base line measurement are performed for every replacement of the reticle, and the reticle alignment and the base line measurement are performed in the quick mode for every exposure of the predetermined number of wafers. Accordingly, it is possible to increase an overlay accuracy between the images of the wafer and the reticle at a high throughput.

While the technique in the above mentioned embodiment has thus been described in conjunction with the base line measurement with the alignment device of the off-axis type used, equivalent effects can be obtained by applying the present invention to a TTL (through the lens) type using within the field of the projection optical system.

It should be understood that the present invention is not limited to the particular embodiment shown and described above, and various changes and modifications may be made without departing from the spirit and scope of the appended claims.

What is claimed is:

1. A method for exposing a second object using a pattern of a first object, comprising:

detecting position information on a plurality of marks on said first object; and obtaining a plurality of error parameters by performing a statistical calculation using one computer equation based on the detected position information.

2. A method according to claim 1, wherein said statistical calculation includes at least square approximation calculation.

3. A method according to claim 1, wherein said plurality of error parameters include linear error data.

4. A method according to claim 1, wherein said plurality of error parameters include error data of a first coordinate system for defining a position of said first object, with a second coordinate system for defining a position of said second object as a reference.

5. A method according to claim 1, wherein said plurality of error parameters include magnification error data.

6. A method according to claim 1, wherein said plurality of error parameters include rotation error data.

7. A method according to claim 1, wherein said plurality of error parameters include offset error data.

8. A method according to claim 1, further comprising:

moving said first object and said second object in respective predetermined scan directions during exposure of said second object.

9. A method according to claim 8, wherein said plurality of error parameters include scaling error data of a scan direction in a first coordinate system for defining a position of said first object and a scan direction in a second coordinate system for defining a position of said second object.

10. A method according to claim 8, wherein said plurality of error parameters include parallelism data of a scan direction in a first coordinate system for defining a position of said first object and a scan direction in a second coordinate system for defining a position of said second object.

11. A method according to claim 8, wherein said plurality of marks comprise a plurality of marks spaced apart from each other in a scan direction in a first coordinate system for defining a position of said first object.

12. A method of manufacturing a device including a process of exposing said second object with the pattern of said first object utilizing the method according to claim 1.

13. An exposure apparatus which exposes a second object with a pattern formed on a first object, comprising:

a mark detecting device, which includes a photoelectric sensor, and which detects position information on a plurality of marks on said first object based on outputs of the photoelectric sensor, and a calculating device, which is electrically connected to said mark detecting device, which has one computer equation, and which obtains a plurality of error parameters by performing a statistical calculation using the computer equation based on the position information detected by the mark detecting device.

14. The apparatus according to claim 13, wherein said statistical calculation includes at least square approximation calculation.

15. The apparatus according to claim 13, wherein said plurality of error parameters include linear error data.

16. The apparatus according to claim 13, wherein said plurality of error parameters include error data of a first coordinate system for defining a position of said first object, with a second coordinate system for defining a position of said second object as a reference.

17. The apparatus according to claim 13, wherein said plurality of error parameters include magnification error data.

18. The apparatus according to claim 13, wherein said plurality of error parameters include rotation error data.

19. The apparatus according to claim 13, wherein said plurality of error parameters include offset error data.

20. The apparatus according to claim 13, wherein said exposure apparatus is a scanning exposure apparatus which moves said first object and said second object in respective predetermined scan directions during exposure of said second object.

21. The apparatus according to claim 20, wherein said plurality of error parameters include scaling error data of a scan direction in a first coordinate system for defining a position of said first object and a scan direction in a second coordinate system for defining a position of said second object.

22. The apparatus according to claim 20, wherein said plurality of error parameters include parallelism data of a scan direction in a first coordinate system for defining a position of said first object and a scan direction in a second coordinate system for defining a position of said second object.

23. The apparatus according to claim 20, wherein said plurality of marks comprise a plurality of marks spaced apart from each other in a scan direction in a first coordinate system for defining a position of said first object.

\* \* \* \* \*

UNITED STATES PATENT AND TRADEMARK OFFICE
CERTIFICATE OF CORRECTION

PATENT NO. : 6,279,881 B1  
DATED : August 28, 2001  
INVENTOR(S) : Kenji Nishi

Page 1 of 1

It is certified that error appears in the above-identified patent and that said Letters Patent is hereby corrected as shown below:

<u>Title page,</u>  
Before Item [51], insert the following:  
-- [30] Foreign Application Priority Data  
Feb. 26, 1993  (JP) ......................5-38077  
Dec. 28, 1993  (JP) ......................5-334759 --

Signed and Sealed this

Sixteenth Day of April, 2002

Attest:

JAMES E. ROGAN  
*Attesting Officer*    *Director of the United States Patent and Trademark Office*